United States Patent
Eto

(10) Patent No.: US 11,482,443 B2
(45) Date of Patent: Oct. 25, 2022

(54) BONDING APPARATUS AND BONDING METHOD

(71) Applicant: Kioxia Corporation, Tokyo (JP)

(72) Inventor: Hideo Eto, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 245 days.

(21) Appl. No.: 17/009,998

(22) Filed: Sep. 2, 2020

(65) Prior Publication Data
US 2021/0287926 A1  Sep. 16, 2021

(30) Foreign Application Priority Data
Mar. 13, 2020 (JP) ............... JP2020-044527

(51) Int. Cl.
| H01L 21/687 | (2006.01) |
| H01L 21/683 | (2006.01) |
| H01L 21/673 | (2006.01) |
| H01L 21/67  | (2006.01) |

(52) U.S. Cl.
CPC ........ *H01L 21/6838* (2013.01); *H01L 21/673* (2013.01); *H01L 21/68721* (2013.01); *H01L 21/67092* (2013.01); *H01L 2221/68381* (2013.01)

(58) Field of Classification Search
CPC .............................................. H01L 21/68721
See application file for complete search history.

(56) References Cited

U.S. PATENT DOCUMENTS

| 4,720,160 A | 1/1988 | Hicks, Jr. |
| 9,165,802 B2 | 10/2015 | Young et al. |
| 9,296,193 B2 | 3/2016 | Burggraf et al. |
| 9,922,851 B2* | 3/2018 | Lin .......... H01L 24/75 |
| 10,906,283 B2 | 2/2021 | Kim et al. |
| 2015/0122412 A1* | 5/2015 | Phillips ............ H01L 24/83 156/273.1 |
| 2019/0228995 A1 | 7/2019 | Wimplinger et al. |

FOREIGN PATENT DOCUMENTS

| CN | 110828325 A | 2/2020 |
| JP | 07-066093 B2 | 7/1995 |
| JP | 2009-194265 A | 8/2009 |
| JP | 5370903 B2 | 12/2013 |
| JP | 2017-168473 A | 9/2017 |
| JP | 2017-168474 A | 9/2017 |

* cited by examiner

*Primary Examiner* — Jae Lee
(74) *Attorney, Agent, or Firm* — Oblon, McClelland, Maier & Neustadt, L.L.P.

(57) ABSTRACT

A bonding apparatus according to the present embodiment includes a first holder and a second holder. The first holder holds a first substrate. The second holder sucks a second substrate, opposes the second substrate to the first substrate, and bonds the second substrate to the first substrate. A first ring stage is provided on an outer circumference of the first holder and allows a first ring member provided on an outer edge of the first substrate to be mounted thereon. A second ring stage is provided on an outer circumference of the second holder and allows a second ring member provided on an outer edge of the second substrate to be mounted thereon. A first heater is provided in the first ring stage. A second heater is provided in the second ring stage.

20 Claims, 21 Drawing Sheets

RNG1, RNG2

RNG1

RNG2

BONDING APPARATUS AND BONDING METHOD

CROSS REFERENCE TO RELATED APPLICATIONS

This application is based upon and claims the benefit of priority from the prior Japanese Patent Application No. 2020-044527, filed on Mar. 13, 2020, the entire contents of which are incorporated herein by reference.

FIELD

The embodiments of the present invention relate to a bonding apparatus and a bonding method.

BACKGROUND

There is known an apparatus of bonding semiconductor substrates to each other by intermolecular forces. This bonding apparatus holds an upper substrate and pushes down the center of the upper substrate by a striker to bring it into contact with the center of a lower substrate. Thereafter, the upper substrate is bonded to the lower substrate from its center to its outer circumferential portion, so that a bonded area is expanded. Accordingly, the upper substrate and the lower substrate are entirely bonded to each other finally.

However, when an outer edge portion of the upper substrate is bonded to the lower substrate, gas between the outer edge portion of the upper substrate and an outer edge portion of the lower substrate makes an abrupt transition from a high-pressure state to a low-pressure state and makes adiabatic expansion. When moisture contained in the gas is condensed because of adiabatic expansion of the gas, voids may be generated between the outer edge portion of the upper substrate and the outer edge portion of the lower substrate. These voids cause poor bonding, leading to reduced reliability.

DETAILED DESCRIPTION

Figure 1:
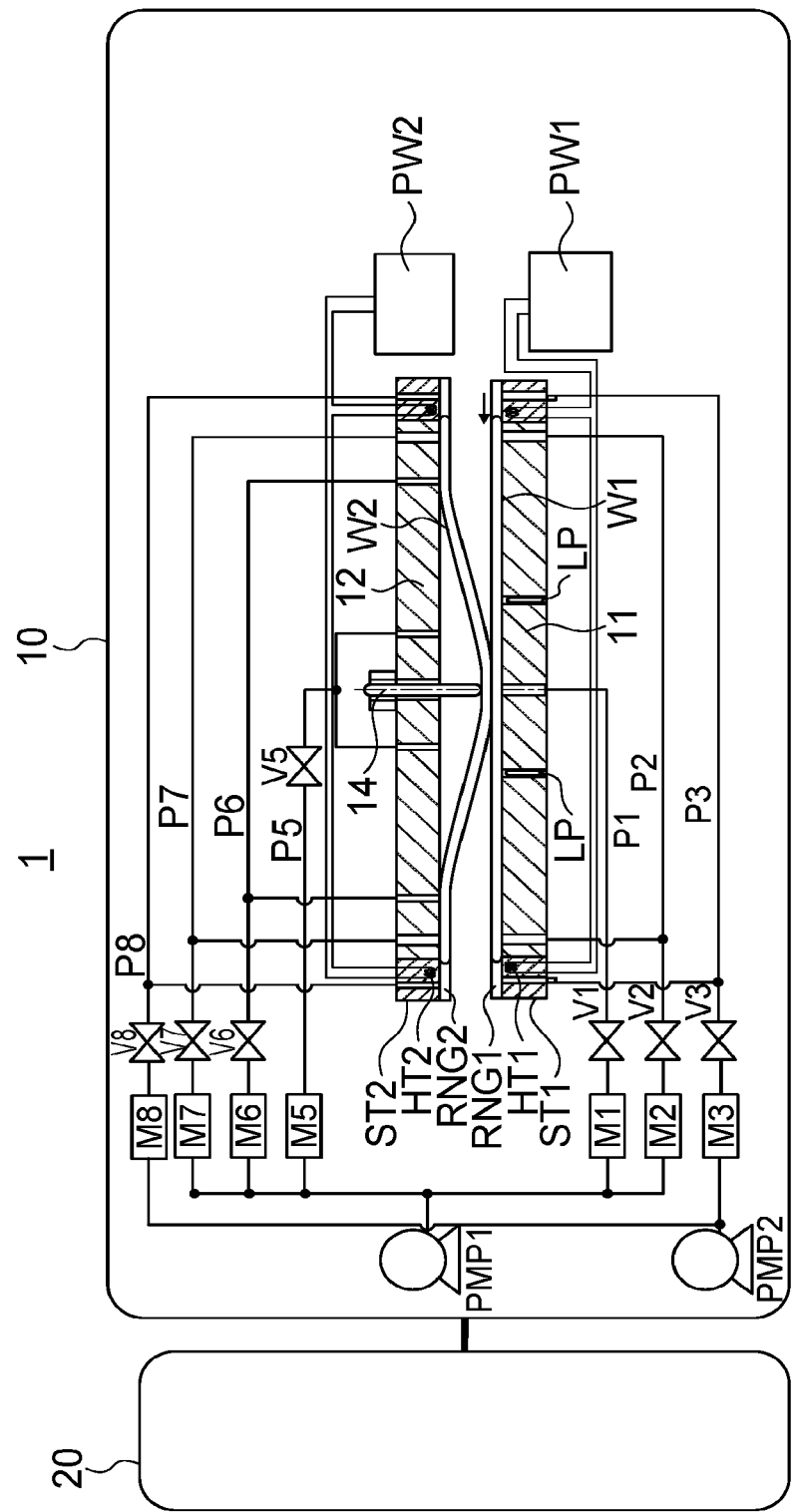
FIG. 1 is a schematic diagram illustrating a configuration example of a bonding apparatus according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A bonding apparatus according to the present embodiment includes a first holder and a second holder. The first holder holds a first substrate. The second holder sucks a second substrate, opposes the second substrate to the first substrate, and bonds the second substrate to the first substrate. A first ring stage is provided on an outer circumference of the first holder and allows a first ring member provided on an outer edge of the first substrate to be mounted thereon. A second ring stage is provided on an outer circumference of the second holder and allows a second ring member provided on an outer edge of the second substrate to be mounted thereon. A first heater is provided in the first ring stage. A second heater is provided in the second ring stage.

First Embodiment

FIG. 1 is a schematic diagram illustrating a configuration example of a bonding apparatus according to a first embodiment. A bonding apparatus 1 bonds a semiconductor wafer W1 and a semiconductor wafer W2 to each other into a single body of semiconductor wafer. The bonding apparatus 1 is used for fabricating an SOI (Silicon On Insulator) substrate or joining wires on the semiconductor wafers W1 and W2 to each other, for example.

The bonding apparatus 1 includes a main body 10 and a control device 20. The main body 10 includes holders 11 and 12, ring stages ST1 and ST2, and heaters HT1 and HT2. The holder 11 can hold the semiconductor wafer W1 by a vacuum chuck or an electrostatic chuck. The holder 12 can hold the semiconductor wafer W2 by a vacuum chuck or an electrostatic chuck. In the following descriptions, it is assumed that the holders 11 and 12 suck the semiconductor wafers W1 and W2 by vacuum chucks in the present embodiment. However, the holders 11 and 12 may hold the semiconductor wafers W1 and W2 by using electrostatic chucks. The holder 12 opposes the semiconductor wafer W2 to the semiconductor wafer W1 on the holder 11 and bonds the semiconductor wafer W2 to the semiconductor wafer W1.

The ring stage ST1 is provided on the outer circumference of the holder 11. The ring stage ST1 allows a ring member RNG1 attached to the outer edge of the semiconductor wafer W1 to be mounted thereon. The heater HT1 is provided within the ring stage ST1. The heater HT1 is connected to a power supply PW1, and can receive power from the power supply PW1 and heat the ring member RNG1. Meanwhile, the ring stage ST2 is provided on the outer circumference of the holder 12. The ring stage ST2 allows a ring member RNG2 attached to the outer edge of the semiconductor wafer W2 to be mounted thereon. The heater HT2 is provided within the ring stage ST2. The heater HT2 is connected to a power supply PW2, and can receive power from the power supply PW2 and heat the ring member RNG2. The power supplies PW1 and PW2 are controlled by the control device 20. The configurations and operations of the holders 11 and 12, the ring stages ST1 and ST2, and the heaters HT1 and HT2 will be described later in more detail.

The control device 20 is, for example, a computer that controls each constituent element of the main body 10.

Pipes P1 and P2 are connected to the holder 11. Openings of the pipes P1 and P2 communicate with a mounting surface of the holder 11 that sucks the semiconductor wafer W1. The opening of the pipe P1 (OP1 in FIG. 2) is provided at the center of the mounting surface of the holder 11. The openings of the pipes P2 (OP2 in FIG. 2) are provided in portions of the mounting surface of the holder 11 which correspond to an end of the semiconductor wafer W1. A pipe P3 is connected to the ring stage ST1. Openings of the pipes P3 (OP3 in FIG. 2) are provided in a mounting surface of the ring stage ST1 that sucks the ring member RNG1. Accordingly, the openings of the pipes P1 to P3 are arranged to be apart from the center of the mounting surface of the holder 11 to an outer edge portion in turn. The number of the pipes P1 to P3 or the openings is not specifically limited.

The pipes P1 and P2 are connected to a vacuum pump PMP1 via gate valves V1 and V2 and pressure/flow-rate adjusters M1 and M2, respectively. The vacuum pump PMP1 exhausts gas from the mounting surface of the holder 11 through the pipes P1 and P2, causing the semiconductor wafer W1 to be sucked onto the mounting surface of the holder 11 by vacuum suction. That is, the vacuum pump PMP1 is a pump for a vacuum chuck. The gate valves V1 and V2 can open and close the pipes P1 and P2, and adjust their ratios of valve opening (opening areas). The pressure/flow-rate adjusters M1 and M2 control the ratios of valve opening of the gate valves V1 and V2 based on air pressures in the pipes P1 and P2 and/or flow rates of gas from the pipes P1 and P2. Accordingly, the semiconductor wafer W1 is sucked onto the mounting surface of the holder 11 with an appropriate pressure.

The pipe P3 is connected to a vacuum pump PMP2 via a gate valve V3 and a pressure/flow-rate adjuster M3. The vacuum pump PMP2 exhausts gas from the mounting surface of the ring stage ST1 through the pipe P3, causing the ring member RNG1 to be sucked onto the mounting surface of the ring stage ST1 by vacuum suction. That is, the vacuum pump PMP2 is also for a vacuum chuck, but is a pump that sucks the ring member RNG1. The gate valve V3 can open and close the pipe P3, and adjusts its ratio of valve opening (an opening area). The pressure/flow-rate adjuster M3 controls the ratio of valve opening of the gate valve V3 based on an air pressure in the pipe P3 and/or a flow rate of gas from the pipe P3. Accordingly, the ring member RNG1 is sucked onto the mounting surface of the ring stage ST1 with an appropriate pressure.

Pipes P5 to P7 are connected to the holder 12. Openings of the pipes P5 to P7 communicate with a mounting surface of the holder 12 that sucks the semiconductor wafer W2. The openings of the pipes P5 (OP5 in FIG. 2) are provided near the center of the mounting surface of the holder 12. The openings of the pipes P6 (OP6 in FIG. 2) are provided at positions closer to the outer edge of the holder 12 than the openings of the pipes P5. The openings of the pipes P7 (OP7 in FIG. 2) are provided at positions further closer to the outer edge of the holder 12 than the openings of the pipes P6. A pipe P8 is connected to the ring stage ST2. An opening of the pipe P8 (OP8 in FIG. 2) is provided on a mounting surface of the ring stage ST2 that sucks the ring member RNG2. Among the pipes P5 to P8, the pipe P8 is provided at the farthest position (the outermost position) from the center of the holder 12. Therefore, the openings of the pipes P5 to P8 are arranged to be apart from the center of the mounting surface of the holder 12 to an outer edge portion in turn. The number of the pipes P5 to P8 or the openings is not specifically limited.

The pipes P5 to P7 are connected to the vacuum pump PMP1 via gate valves V5 to V7 and pressure/flow-rate adjusters M5 to M7, respectively. The vacuum pump PMP1 exhausts gas from the mounting surface of the holder 12 through the pipes P5 to P7, causing the semiconductor wafer W2 to be sucked onto the mounting surface of the holder 12 by vacuum suction. The pipe P8 is connected to the vacuum pump PMP2 via a gate valve V8 and a pressure/flow-rate adjuster M8. The vacuum pump PMP2 exhausts gas from the mounting surface of the ring stage ST2 through the pipe P8, causing the ring member RNG2 to be sucked onto the mounting surface of the ring stage ST2 by vacuum suction. The gate valves V5 to V8 can open and close the pipes P5 to P8, and adjust their ratios of valve opening (opening areas). The pressure/flow-rate adjusters M5 to M8 control the ratios of valve opening of the gate valves V5 to V8 based on air pressures in the pipes P5 to P8 and/or flow rates of gas from the pipes P5 to P8. Accordingly, the semiconductor wafer W2 is sucked onto the mounting surface of the holder 12 with an appropriate pressure. The ring member RNG2 is also sucked onto the mounting surface of the ring stage ST2 with an appropriate pressure.

The holder 11 is provided with lift pins LP. The lift pins LP can lift the bonded semiconductor wafers W1 and W2 from the mounting surface of the holder 11.

A pushing portion (a striker) 14 is provided at the center of the holder 12. The pushing portion 14 is a member that pushes out the center of the semiconductor wafer W2 toward the semiconductor wafer W1 from the holder 12 to start bonding.

Figure 2:
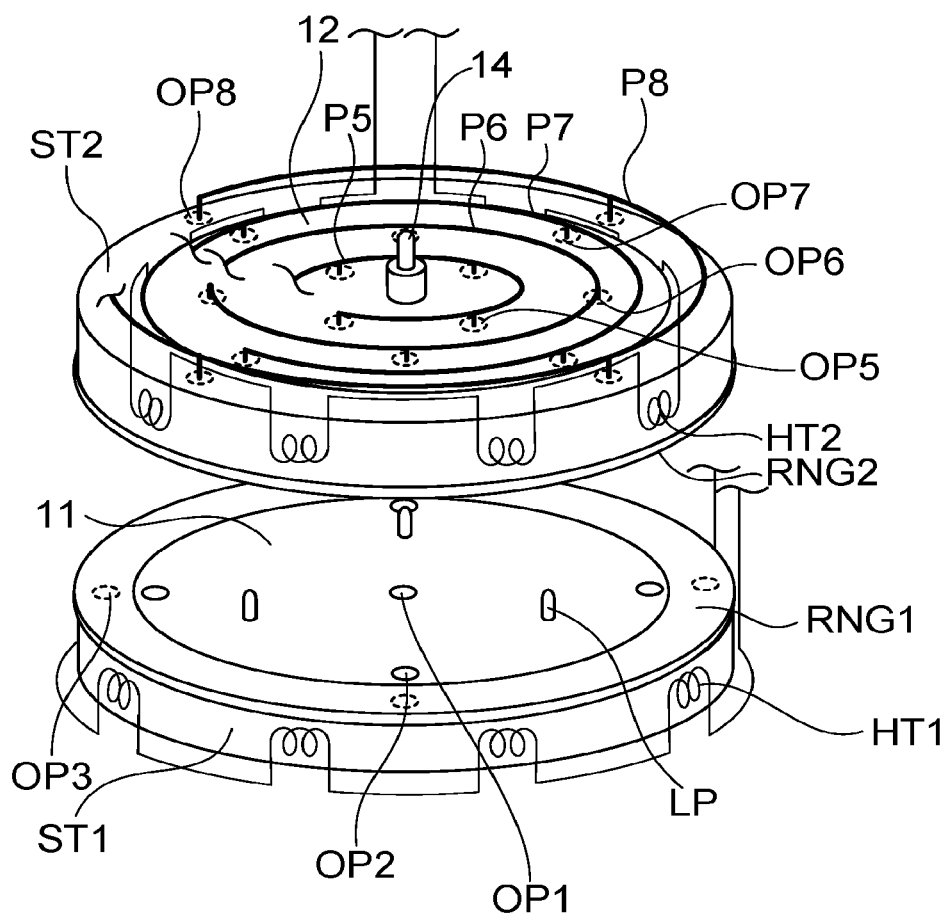
FIG. 2 is a perspective view illustrating a configuration example of holders.

FIG. 2 is a perspective view illustrating a configuration example of the holders 11 and 12. The holder 11 has a substantially circular mounting surface and holds the semiconductor wafer W1 on that mounting surface by sucking it. The holder 11 has the openings OP1 and OP2 in the mounting surface as suction portions that suck the semiconductor wafer W1. The ring stage ST1 has the openings OP3 in a mounting surface thereof as suction portions that suck the ring member RNG1. The openings OP1 to OP3 communicate with the pipes P1 to P3 in FIG. 1, respectively, and are arranged on concentric circles about the center of the mounting surface of the holder 11 substantially evenly. The opening OP1 is arranged to be closer to the center than the other openings OP2 and OP3. The openings OP2 are arranged to be farther from the center than the opening OP1 and be inside the openings OP3. The openings OP3 are farther from the center than the other openings OP1 and OP2 and suck the ring member RNG1.

The holder 12 has a substantially circular mounting surface and holds the semiconductor wafer W2 on that mounting surface by sucking it. The holder 12 has the openings OP5 to OP7 in the mounting surface as suction portions that suck the semiconductor wafer W2. The ring stage ST2 has the openings OP8 in a mounting surface thereof as ring suction portions that suck the ring member RNG2. The openings OP5 to OP8 communicate with the pipes P5 to P8, respectively, and are arranged on concentric circles about the center of the mounting surface of the holder 12 substantially evenly. The openings OP5 are arranged to be closer to the center than the other openings OP6 to OP8 and suck the semiconductor wafer W2 in an auxiliary manner. The openings OP6 are arranged to be farther from the center than the openings OP5 and be inside the openings OP7 and OP8. The openings OP6 also suck the semiconductor wafer W2 in an auxiliary manner. The openings OP7 are arranged to be farther from the center than the openings OP5 and OP6 and be inside the openings OP8. The openings OP8 are the farthest openings from the center among the openings OP5 to OP8 and suck the ring member RNG2. In a bonding process, after the openings OP5 to OP7 stop suction of the semiconductor wafer W2 and separate it therefrom, the openings OP8 stop suction of the ring member RNG2 attached to the semiconductor wafer W2 and separate it therefrom.

The holder 12 sucks the semiconductor wafer W2, and bonds it to the semiconductor wafer W1 held on the holder 11 while opposing them to each other. At this time, suction (evacuation) is weakened or stopped from a closer opening to the center of the holder 12 to a farther opening, that is, in the order of the openings OP5, OP6, OP7, and OP8. When suction by the openings OP5 is weakened or stopped, the pushing portion (the striker) 14 provided at the center of the holder 12 pushes out the center of the semiconductor wafer W2 from the holder 12 toward the semiconductor wafer W1. Accordingly, the center of the semiconductor wafer W2 is pushed out toward the semiconductor wafer W1 as illustrated in FIG. 1, and comes into contact with the semiconductor wafer W1. Next, suction by the openings OP6 is weakened or stopped, and the semiconductor wafer W2 is brought into contact with the semiconductor wafer W1 from the center of the semiconductor wafer W2 to radially outer side. Accordingly, bonding between the semiconductor wafer W1 and the semiconductor wafer W2 spreads from the center to the outer edge. Suction by the openings OP7 is weakened or stopped, and bonding is caused to spread from the center of the semiconductor wafer W2 to the outer edge. Finally, suction by the openings OP8 is weakened or stopped, and the ring member RNG2 attached to the outer edge of the semiconductor wafer W2 is brought into contact with the ring member RNG1. The holders 11 and 12 may be turned upside down.

The ring stages ST1 and ST2 are provided substantially annularly along the outer edges of the holders 11 and 12 and include the heaters HT1 and HT2 inside, respectively. The heaters HT1 and HT2 can heat the ring members RNG1 and RNG2 by heating the ring stages ST1 and ST2, respectively. The ring members RNG1 and RNG2 are made of a material that thermally expands, for example, a resin or an elastomer and are configured to be substantially annular, as with the ring stages ST1 and ST2. The ring members RNG1 and RNG2 have substantially the same sizes (the inner diameters and the outer diameters) as the ring stages ST1 and ST2, respectively, in a plan view when viewed from above the mounting surfaces of the holders 11 and 12. Further, the ring members RNG1 and RNG2 have the inner diameters that are substantially equal to or slightly smaller than the outer diameters of the semiconductor wafers W1 and W2, respectively. Furthermore, inner side surfaces of the ring members RNG1 and RNG2 have depressions corresponding to the shapes of side surfaces of the semiconductor wafers W1 and W2 in such a manner that those depressions fit to the outer edges (the side surfaces) of the semiconductor wafers W1 and W2, respectively. The configurations of the ring members RNG1 and RNG2 will be described later.

The heater HT1 receives power from the power supply PW1 and, when the ring member RNG1 is attached to and detached from the semiconductor wafer W1 mounted on the holder 11, heats the ring member RNG1. The ring member RNG1 expands by being heated, so that the outer diameter and the inner diameter thereof increase. Accordingly, the inner diameter of the ring member RNG1 becomes larger than the outer diameter of the semiconductor wafer W1, and the semiconductor wafer W1 can be placed on the holder 11 inside the ring member RNG1. After the semiconductor wafer W1 is placed inside the ring member RNG1, heating by the heater HT1 is stopped. The ring member RNG1 is cooled and contracts, so that the outer diameter and the inner diameter thereof are returned to original diameters. Accordingly, the inner diameter of the ring member RNG1 becomes substantially equal to the outer diameter of the semiconductor wafer W1, and the ring member RNG1 can be attached to the outer edge of the semiconductor wafer W1.

Similarly, the heater HT2 also receives power from the power supply PW2 and, when the ring member RNG2 is attached to and detached from the semiconductor wafer W2 mounted on the holder 12, heats the ring member RNG2. The ring member RNG2 expands by being heated, so that the outer diameter and the inner diameter thereof increase. Accordingly, the inner diameter of the ring member RNG2 becomes larger than the outer diameter of the semiconductor wafer W2, and the semiconductor wafer W2 can be placed on the holder 12 inside the ring member RNG2. After the semiconductor wafer W2 is placed inside the ring member RNG2, heating by the heater HT2 is stopped. The ring member RNG2 is cooled and contracts, so that the outer diameter and the inner diameter thereof are returned to original diameters. Accordingly, the inner diameter of the ring member RNG2 becomes substantially equal to the outer diameter of the semiconductor wafer W2, and the ring member RNG2 can be attached to the outer edge of the semiconductor wafer W2.

In addition, when the semiconductor wafers W1 and W2 are bonded to each other, the ring members RNG1 and RNG2 are in close contact with each other without being bonded to each other. After the semiconductor wafers W1 and W2 are bonded to each other, the heaters HT1 and HT2 cause the ring members RNG1 and RNG2 to expand by heating them, thereby separating them from the semiconductor wafers W1 and W2. The lift pins LP then lift the bonded semiconductor wafers W1 and W2, so that the semiconductor wafers W1 and W2 can be detached from the ring members RNG1 and RNG2.

An air pressure in a space between the holders 11 and 12 (hereinafter, also "chamber") may be an ordinary pressure, a reduced pressure, or a vacuum. However, it is preferable that the air pressure in the chamber is an ordinary pressure or a reduced pressure in order to improve throughput of a bonding process. Gas in the chamber may be inert gas, for example, helium, nitrogen, or argon, or dry air.

In a case where the ring members RNG1 and RNG2 are not attached to the semiconductor wafers W1 and W2, an outer edge portion of the semiconductor wafer W2 hits the semiconductor wafer W1 vigorously when being finally joined to the semiconductor wafer W1. At this time, gas between the semiconductor wafers W1 and W2 makes an abrupt transition from a high-pressure state to a low-pressure state and makes adiabatic expansion. When moisture contained in the gas is condensed because of this adiabatic expansion of the gas, voids may be generated at the outer edge portions between the semiconductor wafers W1 and W2.

Meanwhile, according to the present embodiment, the ring members RNG1 and RNG2 are provided on the outer edges of the semiconductor wafers W1 and W2. Therefore, the outer edges of the semiconductor wafers W1 and W2 are substantially extended by the ring members RNG1 and RNG2. Bonding between the semiconductor wafers W1 and W2 spreads from the center of the semiconductor wafers W1 and W2 to the outer edges, and the ring members RNG1 and RNG2 come into contact with each other finally. Therefore, when the semiconductor wafer W2 is separated from the openings OP7 and is joined to the semiconductor wafer W1, the ring member RNG2 has not come into close contact with the ring member RNG1 yet. Accordingly, when the semiconductor wafers W1 and W2 are bonded to each other, the gas between the semiconductor wafers W1 and W2 has not made adiabatic expansion yet in regions of the openings OP7.

When the ring member RNG2 is separated from the openings OP8 and comes into close contact with the ring member RNG1, the spreading speed of contact between the ring member RNG1 and the ring member RNG2 increases. Therefore, gas between the ring members RNG1 and RNG2 makes an abrupt transition from a high-pressure state to a low-pressure state and makes adiabatic expansion, and therefore moisture may be condensed between the ring members RNG1 and RNG2. However, because the ring members RNG1 and RNG2 are detached from the semiconductor wafers W1 and W2 after the semiconductor wafers W1 and W2 are bonded to each other, condensation does not become a problem even when it occurs.

Meanwhile, the speed of adiabatic expansion of the gas between the semiconductor wafers W1 and W2 is reduced because of the ring members RNG1 and RNG2. Therefore, condensation between the semiconductor wafers W1 and W2 is prevented. As a result, it is possible to prevent generation of voids between the semiconductor wafers W1 and W2.

Next, a method of bonding the semiconductor wafers W1 and W2 to each other is further described.

FIGS. 3A to 3J are cross-sectional views illustrating an example of a method of bonding the semiconductor wafers W1 and W2 to each other according to the first embodiment. In FIGS. 3A to 3J, the holders 11 and 12 are illustrated at positions opposed to each other for the sake of convenience. However, when the semiconductor wafers W1 and W2 and the ring members RNG1 and RNG2 are mounted on the holders 11 and 12 and the ring stages ST1 and ST2, the holders 11 and 12 and the ring stages ST1 and ST2 may be arranged with their mounting surfaces facing up.

Figure 3A:
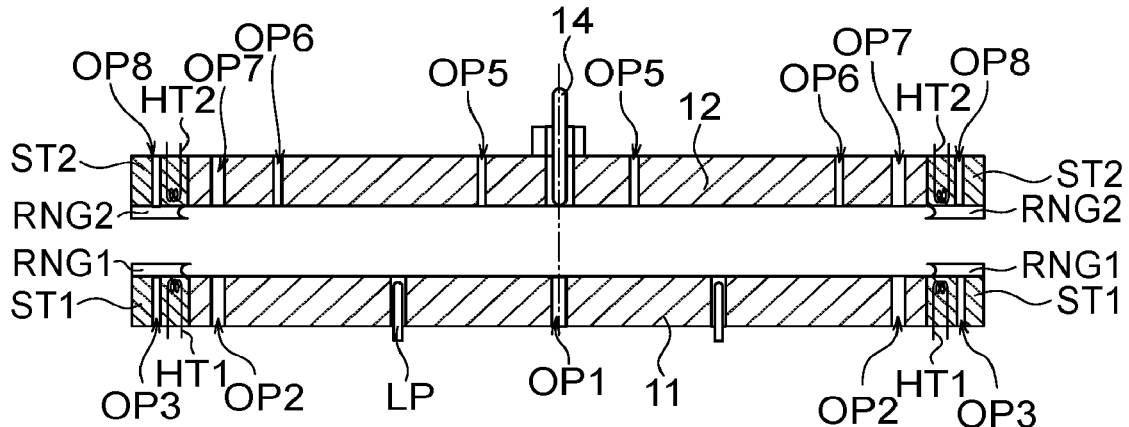
FIG. 3A is a cross-sectional view illustrating an example of a method of bonding semiconductor wafers to each other according to the first embodiment.

First, as illustrated in FIG. 3A, the ring members RNG1 and RNG2 are placed on the ring stages ST1 and ST2 and are sucked by the openings OP3 and OP8 by vacuum suction, respectively. Next, the power supplies PW1 and PW2 supply power to the heaters HT1 and HT2, and the heaters HT1 and HT2 heat the ring members RNG1 and RNG2 via the ring stages ST1 and ST2. Accordingly, the ring members RNG1 and RNG2 thermally expand, so that the inner diameters thereof increase.

Figure 3B:
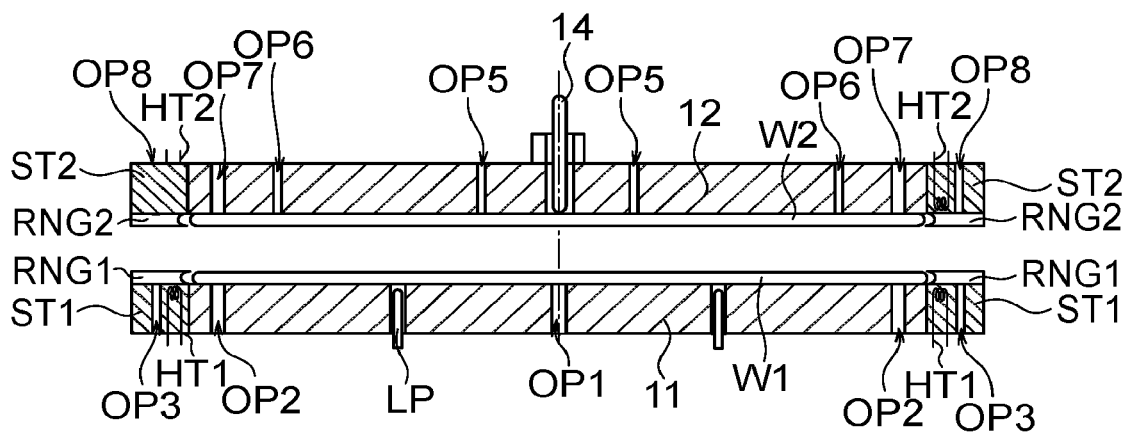
FIG. 3B is a cross-sectional view illustrating an example of the bonding method following FIG. 3A.

Next, as illustrated in FIG. 3B, the semiconductor wafer W1 is placed on a mounting surface of the holder 11 inside the ring member RNG1. In addition, the semiconductor wafer W2 is placed on a mounting surface of the holder 12 inside the ring member RNG2. At this time, the ring members RNG1 and RNG2 have thermally expanded, and the inner diameters thereof have become larger than the outer diameters of the semiconductor wafers W1 and W2. Therefore, the semiconductor wafers W1 and W2 can be placed inside the ring members RNG1 and RNG2.

Figure 3C:
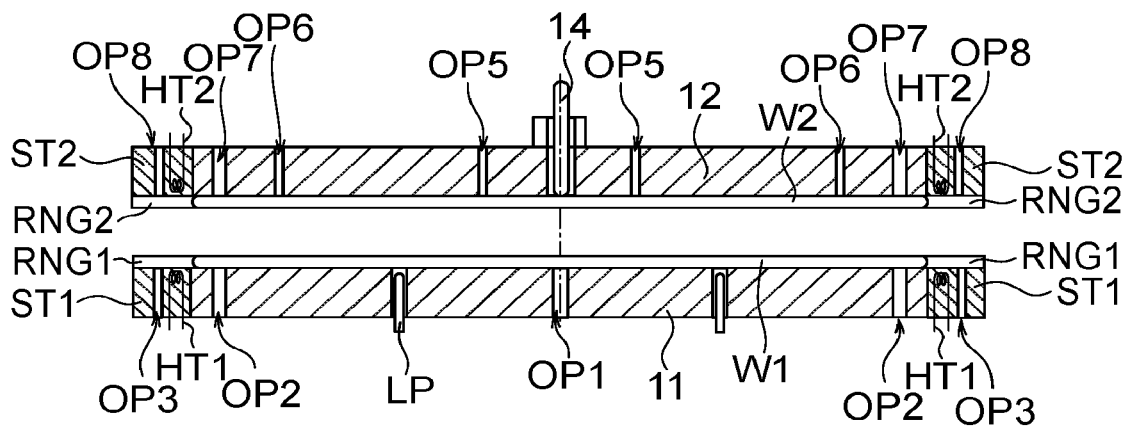
FIG. 3C is a cross-sectional view illustrating an example of the bonding method following FIG. 3B.

Next, power supply from the power supplies PW1 and PW2 is stopped, and heating by the heaters HT1 and HT2 is stopped. Accordingly, the ring members RNG1 and RNG2 and the ring stages ST1 and ST2 are naturally cooled, so that the ring members RNG1 and RNG2 thermally contract. Accordingly, as illustrated in FIG. 3C, the ring members RNG1 and RNG2 are attached to the outer edges of the semiconductor wafers W1 and W2, respectively.

Figure 4A:
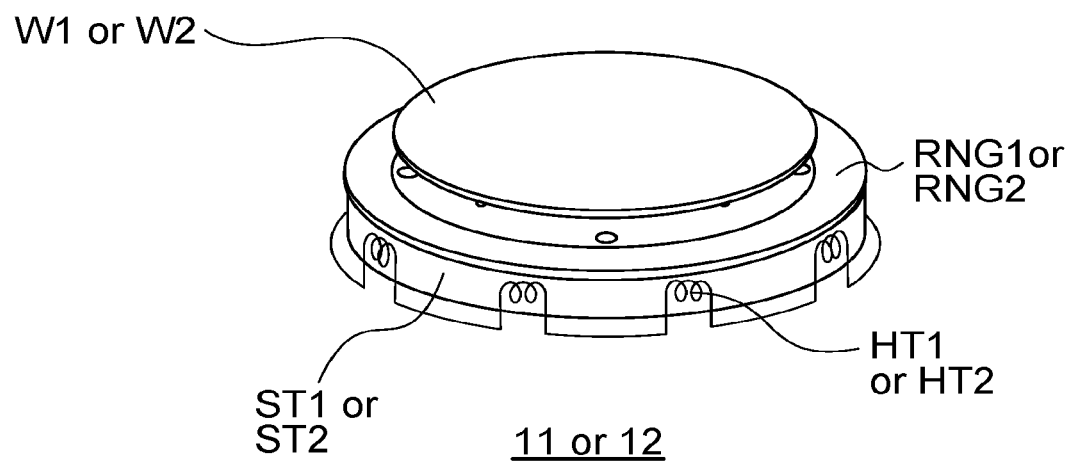
FIG. 4A is a perspective view illustrating attaching a ring member to the semiconductor wafer.
Figure 4B:
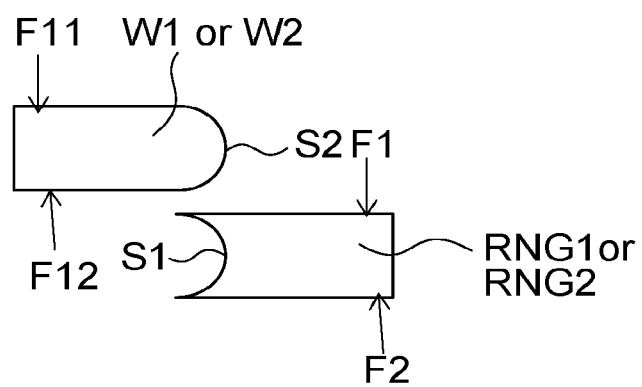
FIG. 4B is a cross-sectional view illustrating ends of the ring member and the semiconductor wafer when the ring member is attached to the semiconductor wafer.
Figure 5A:
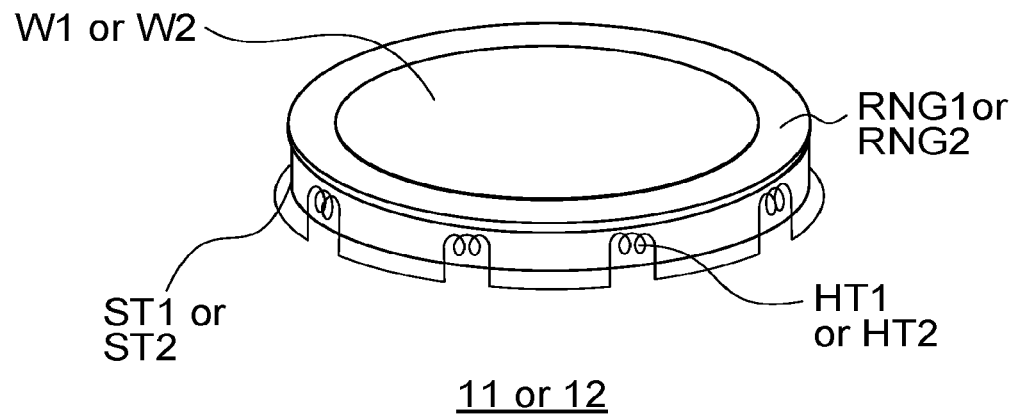
FIG. 5A is a perspective view illustrating attaching the ring member to the semiconductor wafer.
Figure 5B:
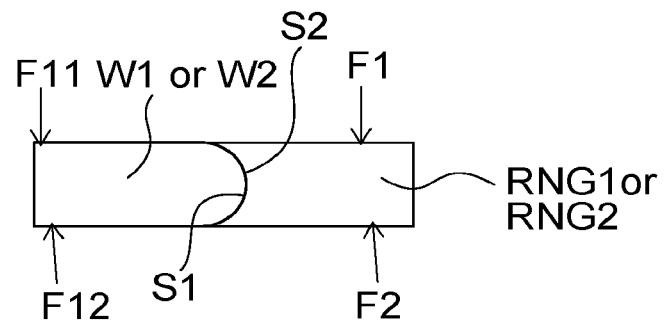
FIG. 5B is a cross-sectional view illustrating ends of the ring member and the semiconductor wafer when the ring member is attached to the semiconductor wafer.

FIGS. 4A and 5A are perspective views illustrating attaching the ring member RNG1 or RNG2 to the semiconductor wafer W1 or W2. FIGS. 4B and 5B are cross-sectional views illustrating ends of the ring member RNG1 or RNG2 and the semiconductor wafer W1 or W2. The following descriptions are made to the ring member RNG1 and the semiconductor wafer W1, and descriptions of the ring member RNG2 and the semiconductor wafer W2 are omitted.

As illustrated in FIGS. 4A and 5A, the ring member RNG1 is an annular member along the outer edge of the semiconductor wafer W1. The inner diameter of the ring member RNG1 is substantially equal to or slightly smaller than the outer diameter of the semiconductor wafer W1. As illustrated in FIG. 4B, an inner side surface S1 of the ring member RNG1 has a shape corresponding to an outer side surface S2 of an end of the semiconductor wafer W1. The outer side surface S2 of the semiconductor wafer W1 is usually convex and rounded and has a substantially semi-circular shape. Therefore, the inner side surface S1 of the ring member RNG1 has, for example, a depressed semicircular shape in such a manner that the inner side surface S1 can receive the outer side surface S2 of the semiconductor wafer W1 and fit to the outer side surface S2.

The ring member RNG1 having this configuration is caused to thermally expand once, the semiconductor wafer W1 is placed inside the ring member RNG1, and thereafter the ring member RNG1 is caused to thermally contract. Accordingly, as illustrated in FIGS. 5A and 5B, the inner side surface S1 of the ring member RNG1 fits to the outer side surface S2 of the semiconductor wafer W1, so that the ring member RNG1 is attached to the outer edge of the semiconductor wafer W1. In a bonding process, the ring member RNG1 is integrated with the semiconductor wafer W1 and functions as an outer edge portion. The ring member RNG2 is also attached to the semiconductor wafer W2 in an identical manner. Referring back to FIG. 3C, the semiconductor wafers W1 and W2 are sucked onto the holders 11 and 12, respectively. The ring members RNG1 and RNG2 are sucked onto the ring stages ST1 and ST2, respectively.

At this time, the gate valves V1 to V3 and V5 to V8 in FIG. 1 are in an opened state, and the vacuum pumps PMP1 and PMP2 suck the semiconductor wafers W1 and W2 or the ring members RNG1 and RNG2 onto the holders 11 and 12 or the ring stages ST1 and ST2 by vacuum suction via the pipes P1 to P3 and P5 to P8, respectively.

The ring members RNG1 and RNG2 are in close contact with each other when the semiconductor wafers W1 and W2 have been bonded to each other. Therefore, when the ring members RNG1 and RNG2 have been attached to the semiconductor wafers W1 and W2, a top surface F1 and/or a back surface F2 of the ring member RNG1 are substantially flush with a top surface F11 and/or a back surface F12 of the semiconductor wafer W1, respectively. A top surface F1 and/or a back surface F2 of the ring member RNG2 are also substantially flush with a top surface F11 and/or a back surface F12 of the semiconductor wafer W2, respectively. Accordingly, the semiconductor wafer W1 and the ring member RNG1 are configured as if they form a single substrate, and the ring member RNG1 functions as if the outer edge portion of the semiconductor wafer W1 is extended substantially. Further, the semiconductor wafer W2 and the ring member RNG2 are configured as if they form a single substrate, and the ring member RNG2 functions as if the outer edge portion of the semiconductor wafer W2 is extended substantially.

After the ring members RNG1 and RNG2 are attached to the semiconductor wafers W1 and W2, the holder 12 opposes the semiconductor wafer W2 to the semiconductor wafer W1 on the holder 11, as illustrated in FIG. 3C. The holder 12 brings the semiconductor wafer W2 closer to the semiconductor wafer W1 in order to make a distance between the semiconductor wafers W1 and W2 a predetermined distance. At this time, the holders 11 and 12 suck the entire back surfaces of the semiconductor wafers W1 and W2, respectively.

Figure 3D:
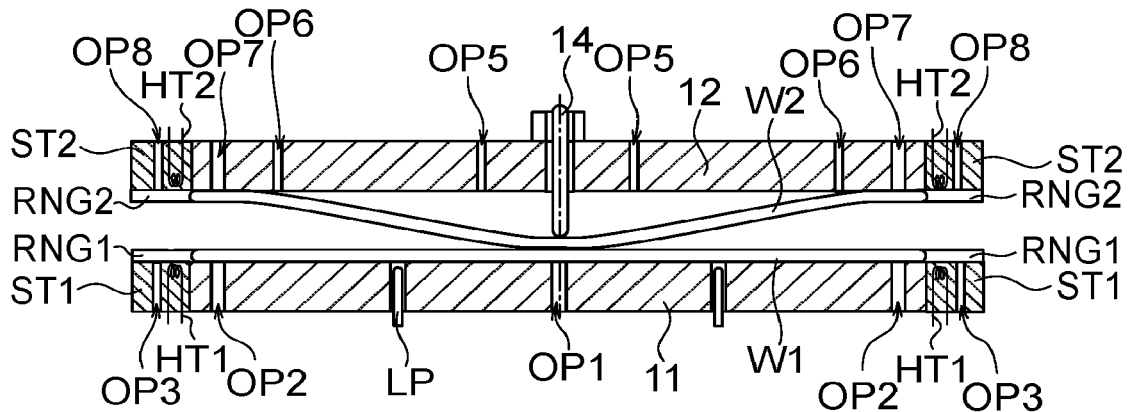
FIG. 3D is a cross-sectional view illustrating an example of the bonding method following FIG. 3C.

Next, the gate valve V5 in FIG. 1 is in a closed state. Accordingly, evacuation through the openings OP5 is stopped. Also, the pushing portion 14 pushes out the back surface of the semiconductor wafer W2 from the center of the holder 12 toward the semiconductor wafer W1, as illustrated in FIG. 3D. Accordingly, the center of the semiconductor wafer W2 can come closer to the semiconductor wafer W1 and come into contact with the semiconductor wafer W1.

At this time, at the center of the holder 12, the back surface of the semiconductor wafer W2 is separated from the holder 12 and a top surface of the semiconductor wafer W2 comes into contact with the semiconductor wafer W1. The openings OP6 to OP8 still suck the back surfaces of the semiconductor wafer W2 and the ring member RNG2. Therefore, only the center of the semiconductor wafer W2 comes into contact with the semiconductor wafer W1, and the outer edge portion of the semiconductor wafer W2 and the ring member RNG2 are sucked onto the holder 12 and the ring stage ST2.

Figure 3E:
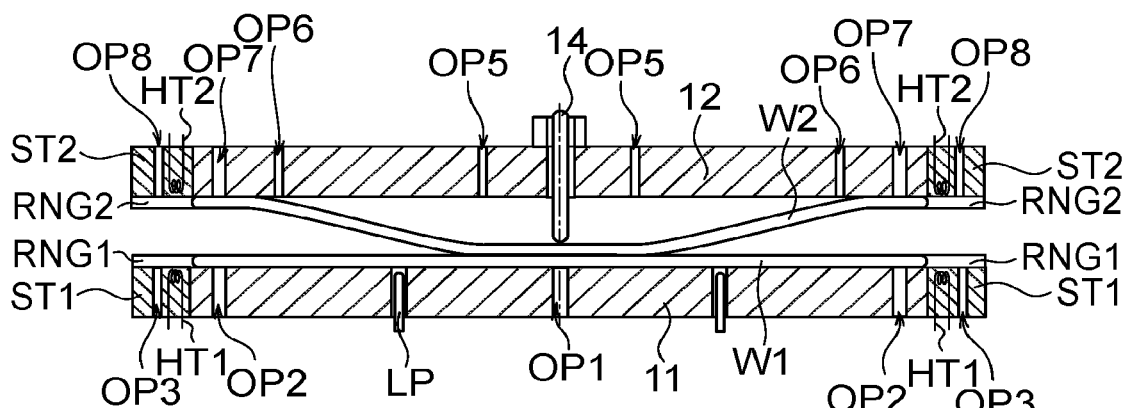
FIG. 3E is a cross-sectional view illustrating an example of the bonding method following FIG. 3D.

Next, the gate valve V6 in FIG. 1 is in a closed state. Accordingly, evacuation through the openings OP6 is stopped. Accordingly, bonding between the semiconductor wafers W1 and W2 spreads from the center thereof to the outer edge portion, as illustrated in FIG. 3E. At this time, the openings OP7 and OP8 suck the semiconductor wafer W2 and the ring member RNG2. Therefore, around the openings OP7 and OP8, the semiconductor wafer W2 and the ring member RNG2 are still sucked onto the holder 12 and the ring stage ST2.

Figure 3F:
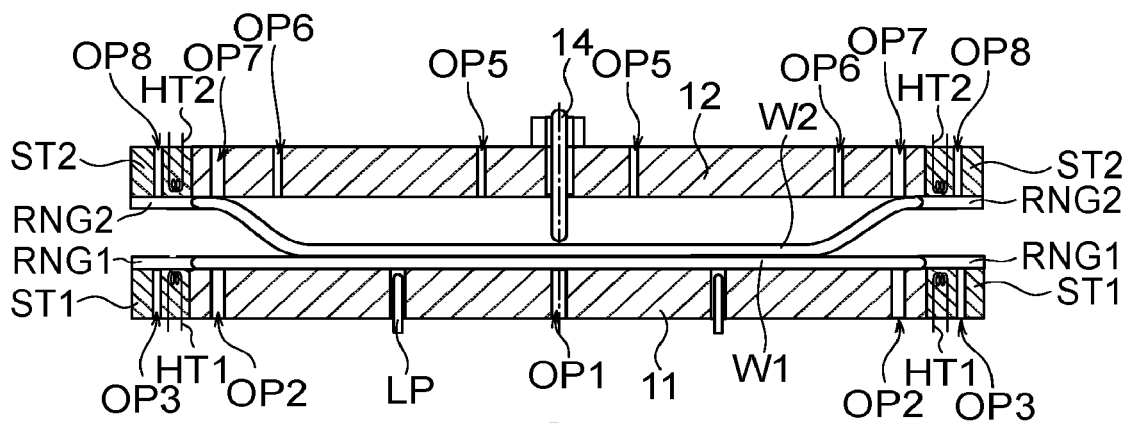
FIG. 3F is a cross-sectional view illustrating an example of the bonding method following FIG. 3E.

Next, the gate valve V7 in FIG. 1 is in a closed state. Accordingly, evacuation through the openings OP7 is stopped. Accordingly, bonding between the semiconductor wafers W1 and W2 further spreads from the center thereof to the outer edge portion, as illustrated in FIG. 3F. At this time, around the openings OP8, the ring member RNG2 is still sucked onto the ring stage ST2.

Figure 3G:
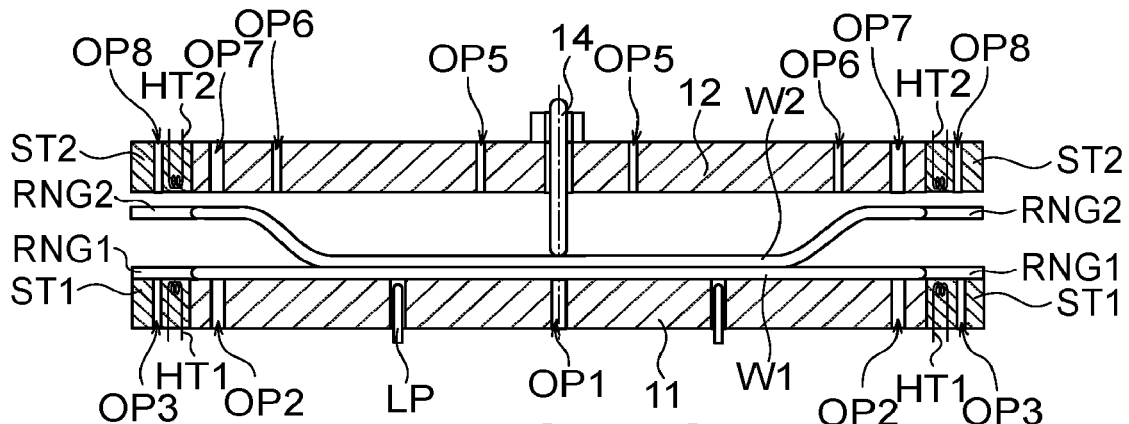
FIG. 3G is a cross-sectional view illustrating an example of the bonding method following FIG. 3F.
Figure 3H:
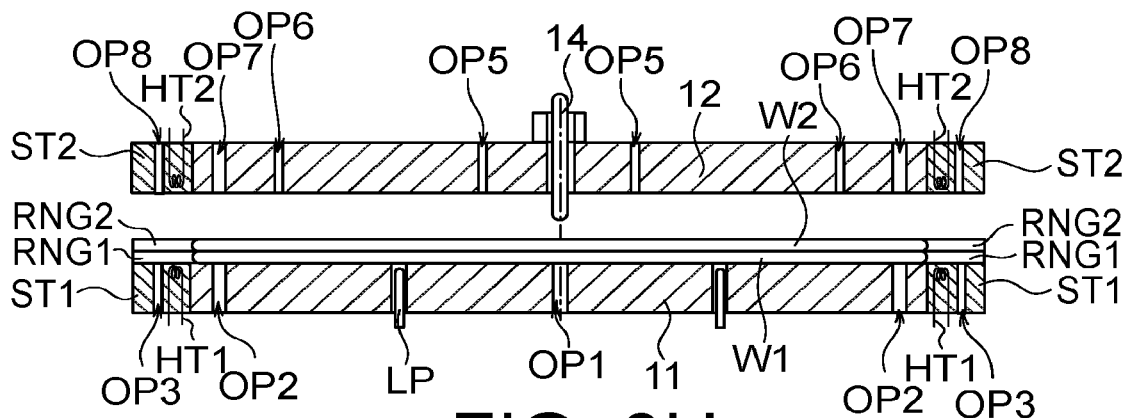
FIG. 3H is a cross-sectional view illustrating an example of the bonding method following FIG. 3G.

Next, the gate valve V8 in FIG. 1 is in a closed state. Accordingly, evacuation through the openings OP8 is stopped. At this time, the ring member RNG2 extending from the outer edge portion of the semiconductor wafer W2 is separated from the ring stage ST2, as illustrated in FIG. 3G. Further, as illustrated in FIG. 3H, the semiconductor wafer W2 and the semiconductor wafer W1 are entirely bonded to each other, and the ring member RNG2 is placed on the ring member RNG1 and is in close contact therewith. In this manner, in the present embodiment, the semiconductor wafer W2 is bonded to the semiconductor wafer W1 and the ring member RNG2 is brought into contact with the ring member RNG1.

When bonding spreads from the center of the semiconductor wafer W2 toward the ring member RNG2, the spreading speed increases as a bonding region becomes closer to the outer edge of the semiconductor wafer W2 and the ring member RNG2. That is, the spreading speed is higher in the outer edge portions of the semiconductor wafers W1 and W2 than at the center thereof. In the present embodiment, the ring members RNG1 and RNG2 are provided on the outer edge portions of the semiconductor wafers W1 and W2. Accordingly, the outer edge portions of the semiconductor wafers W1 and W2 are substantially extended, and the speed of bonding between the actual outer edge portion of the semiconductor wafer W1 and the actual outer edge portion of the semiconductor wafer W2 is moderated. Therefore, a pressure difference between the semiconductor wafers W1 and W2 is substantially moderated. As a result, it is possible to prevent condensation between the semiconductor wafers W1 and W2 and prevent generation of voids.

Figure 3I:
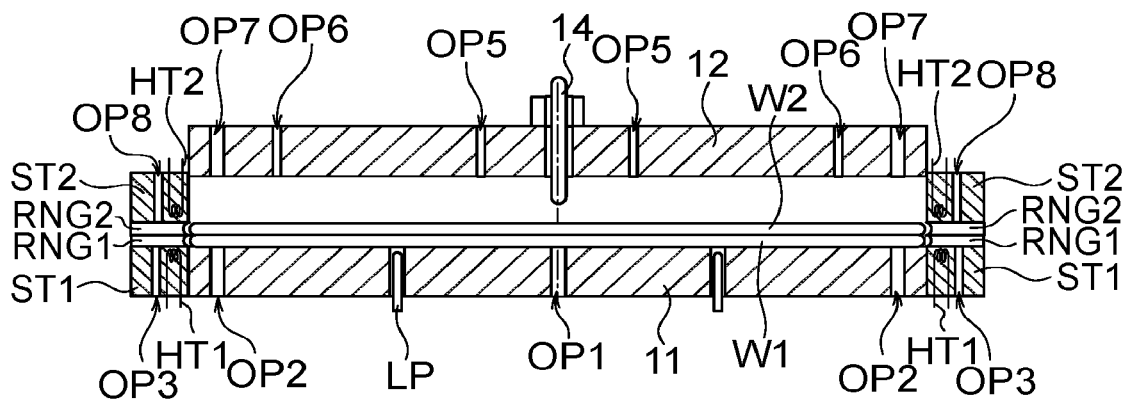
FIG. 3I is a cross-sectional view illustrating an example of the bonding method following FIG. 3H.

Next, the ring stage ST2 is brought closer to the ring stage ST1 to be brought into contact with the ring member RNG2. For example, FIGS. 6A to 7B are perspective views illustrating detaching the ring members RNG1 and RNG2 from the semiconductor wafers W1 and W2. After the semiconductor wafers W1 and W2 are bonded to each other as illustrated FIG. 6A, the ring stage ST2 is moved down in such a manner that a surface of the ring stage ST2 on which the ring member RNG2 has been mounted locally comes closer to the ring stage ST1 with respect to a surface of the holder 12 on which the semiconductor wafer W2 has been mounted, and comes into contact with the ring member RNG2, as illustrated in FIG. 6B. The power supplies PW1 and PW2 supply power to the heaters HT1 and HT2, and the heaters HT1 and HT2 heat the ring members RNG1 and RNG2 via the ring stages ST1 and ST2. Accordingly, the ring members RNG1 and RNG2 thermally expand as illustrated in FIG. 3I, so that the inner diameters thereof increase.

Figure 7A:
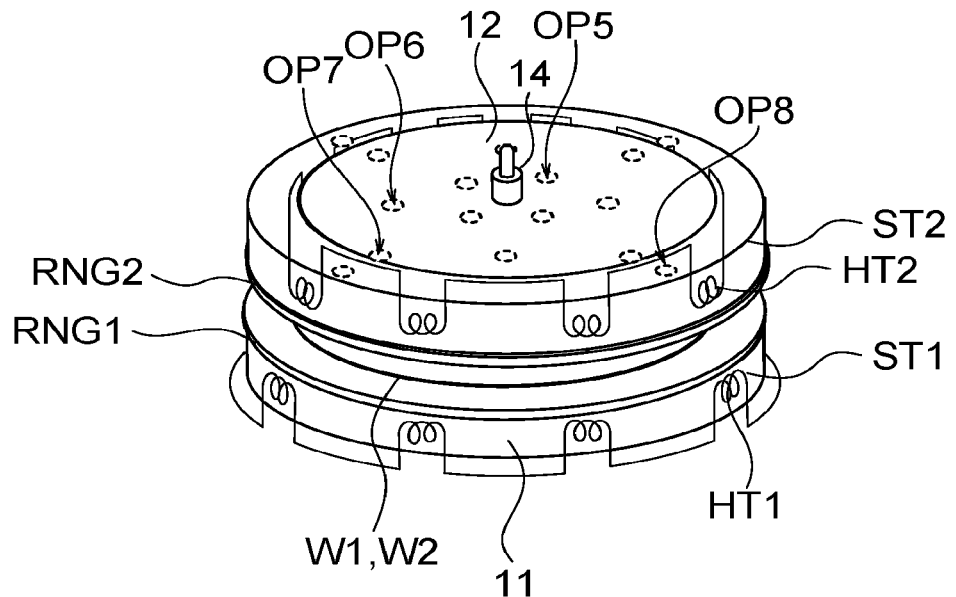
FIG. 7A is a perspective view illustrating detaching the ring members from the semiconductor wafers following FIG. 6B.

Next, as illustrated in FIG. 7A, the ring member RNG2 is sucked by the openings OP8 of the ring stage ST2, and the ring stage ST2 is elevated to the position of the outer circumference of the holder 12 to lift the ring member RNG2. That is, the ring stage ST2 returns to its original position while sucking the ring member RNG2 by the openings OP8. At this time, the ring members RNG1 and RNG2 have thermally expanded, and the inner diameters thereof have increased. Further, because the ring member RNG2 has been placed on the ring member RNG1 without being bonded to the ring member RNG1, the ring stage ST2 can separate only the ring member RNG2 from the ring member RNG1 while the semiconductor wafers W1 and W2 remain bonded to each other, as illustrated in FIG. 7A.

Figure 3J:
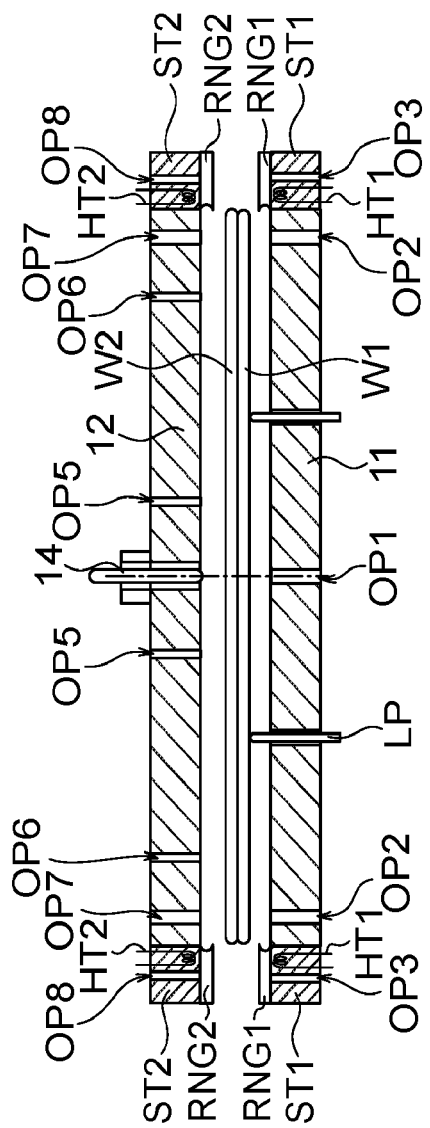
FIG. 3J is a cross-sectional view illustrating an example of the bonding method following FIG. 3I.
Figure 7B:
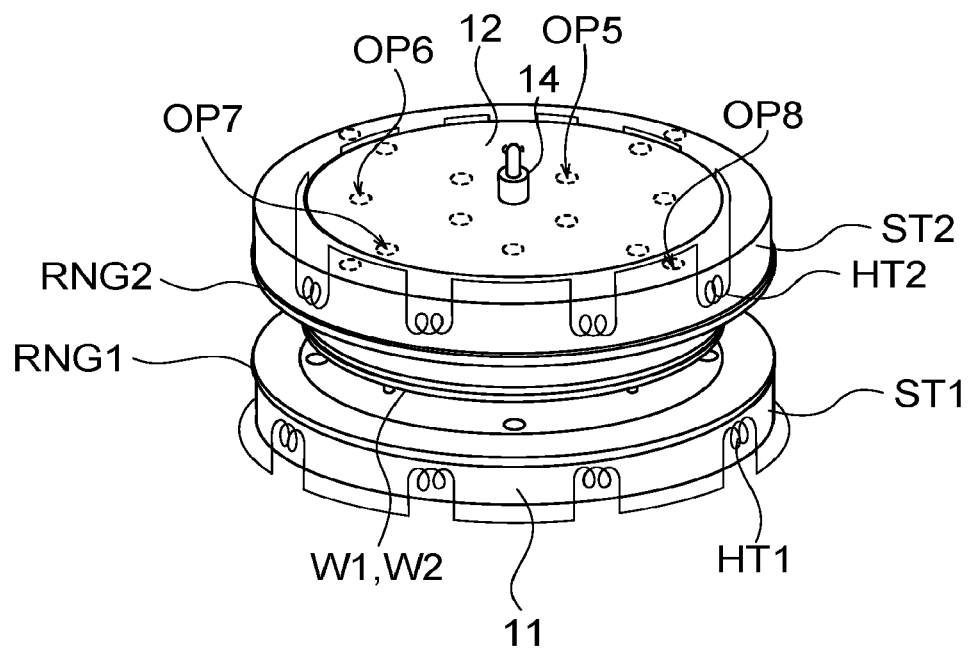
FIG. 7B is a perspective view illustrating detaching the ring members from the semiconductor wafers following FIG. 7A.

Next, as illustrated in FIGS. 3J and 7B, the semiconductor wafers W1 and W2 are lifted by the lift pins LP. At this time, the ring member RNG1 has thermally expanded, and the inner diameter thereof has become larger than the outer diameters of the semiconductor wafers W1 and W2. Accordingly, the semiconductor wafers W1 and W2 can be detached from the ring member RNG1.

The bonded semiconductor wafers W1 and W2 are transported from between the holders 11 and 12. With this step, a series of bonding processes is ended.

In the state illustrated in FIG. 6B, when the ring member RNG2 is detached from the ring member RNG1, only the ring stage ST2 on the holder 12 side can be moved toward the ring stage ST1. However, the holder 12 may be also moved together with the ring stage ST2 to the semiconductor wafers W1 and W2. In this case, by controlling the valves V5 to V8, the openings OP8 of the ring stage ST2 are caused to suck the ring member RNG2 and the other openings OP5 to OP7 are prevented from sucking the semiconductor wafer W2. Even when the above control is executed, the ring stage ST2 can separate the ring member RNG2 from the ring member RNG1 while the semiconductor wafers W1 and W2 remain bonded to each other.

Figure 6A:
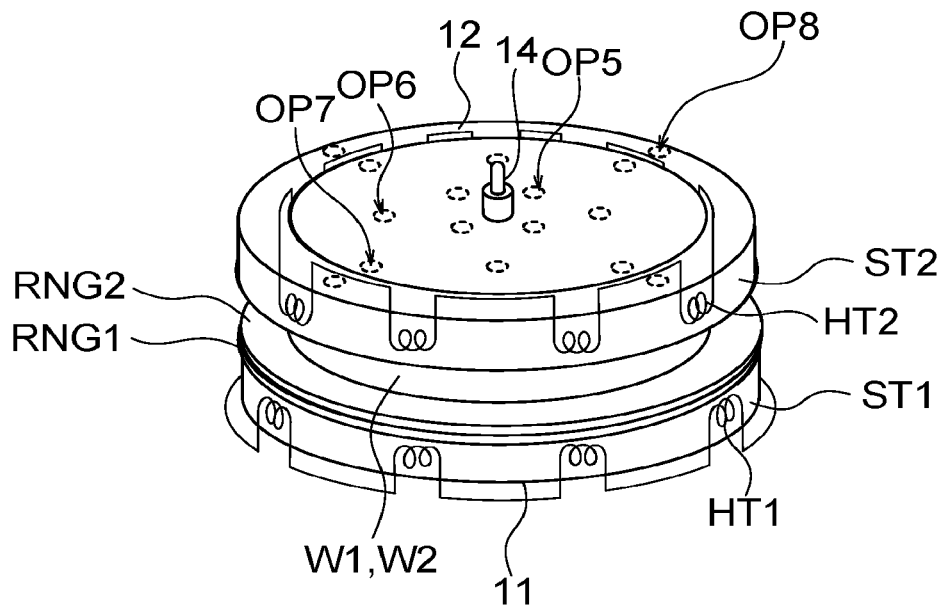
FIG. 6A is a perspective view illustrating detaching the ring members from the semiconductor wafers.
Figure 6B:
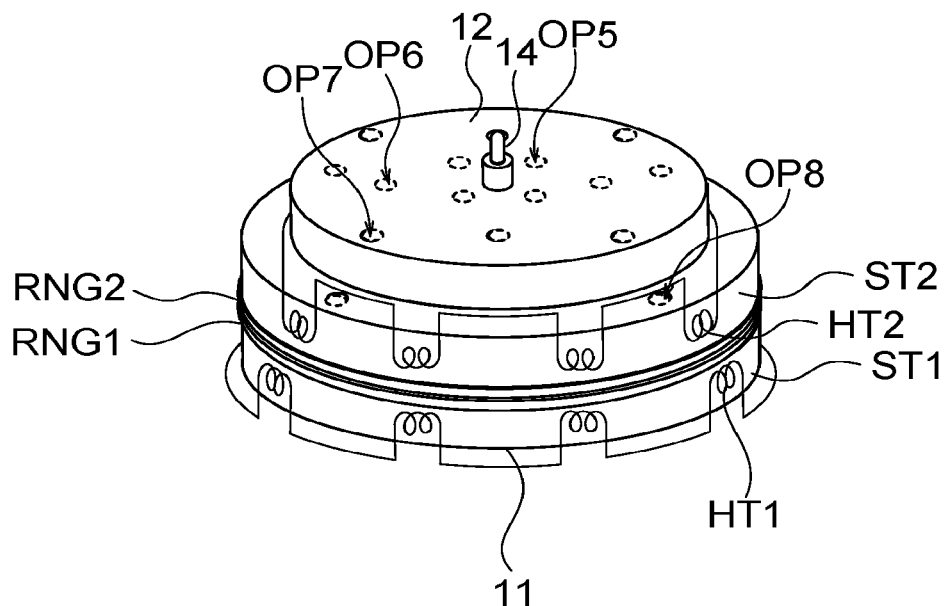
FIG. 6B is a perspective view illustrating detaching the ring members from the semiconductor wafers following FIG. 6A.

Further, in a case where the heater HT1 can heat both the ring members RNG1 and RNG2, the heater HT1 may cause both the ring members RNG1 and RNG2 to thermally expand in the state illustrated in FIG. 6A. In this case, the lift pins LP can lift the bonded semiconductor wafers W1 and W2 with the ring member RNG2 placed on the ring member RNG1. Even in this case, the bonded semiconductor wafers W1 and W2 can be detached from the ring members RNG1 and RNG2.

As described above, according to the present embodiment, the ring members RNG1 and RNG2 are provided on the outer edge portions of the semiconductor wafers W1 and W2. Accordingly, when the actual outer edge portions of the semiconductor wafers W1 and W2 are bonded to each other, the speed of bonding between the semiconductor wafers W1 and W2 is reduced and the speed of adiabatic expansion of gas between the semiconductor wafers W1 and W2 is moderated. As a result, condensation between the semiconductor wafers W1 and W2 is prevented, so that generation of voids between them can be prevented. At this time, because the top surfaces F1 of the ring members RNG1 and RNG2, which are surfaces opposed to each other, are substantially flush with the top surfaces F11 of the semiconductor wafers W1 and W2, which are bonding surfaces, as illustrated in FIG. 5B, bonding spreads appropriately and smoothly.

Further, when the ring member RNG2 comes into close contact with the ring member RNG1, the speed of adiabatic expansion of gas between the ring member RNG1 and the ring member RNG2 increases and the gas between the ring member RNG1 and the ring member RNG2 may be condensed. However, because the ring members RNG1 and RNG2 are detached from the semiconductor wafers W1 and W2 after the semiconductor wafers W1 and W2 are bonded to each other, condensation and generation of voids between them do not become a problem.

Second Embodiment

Figure 8:
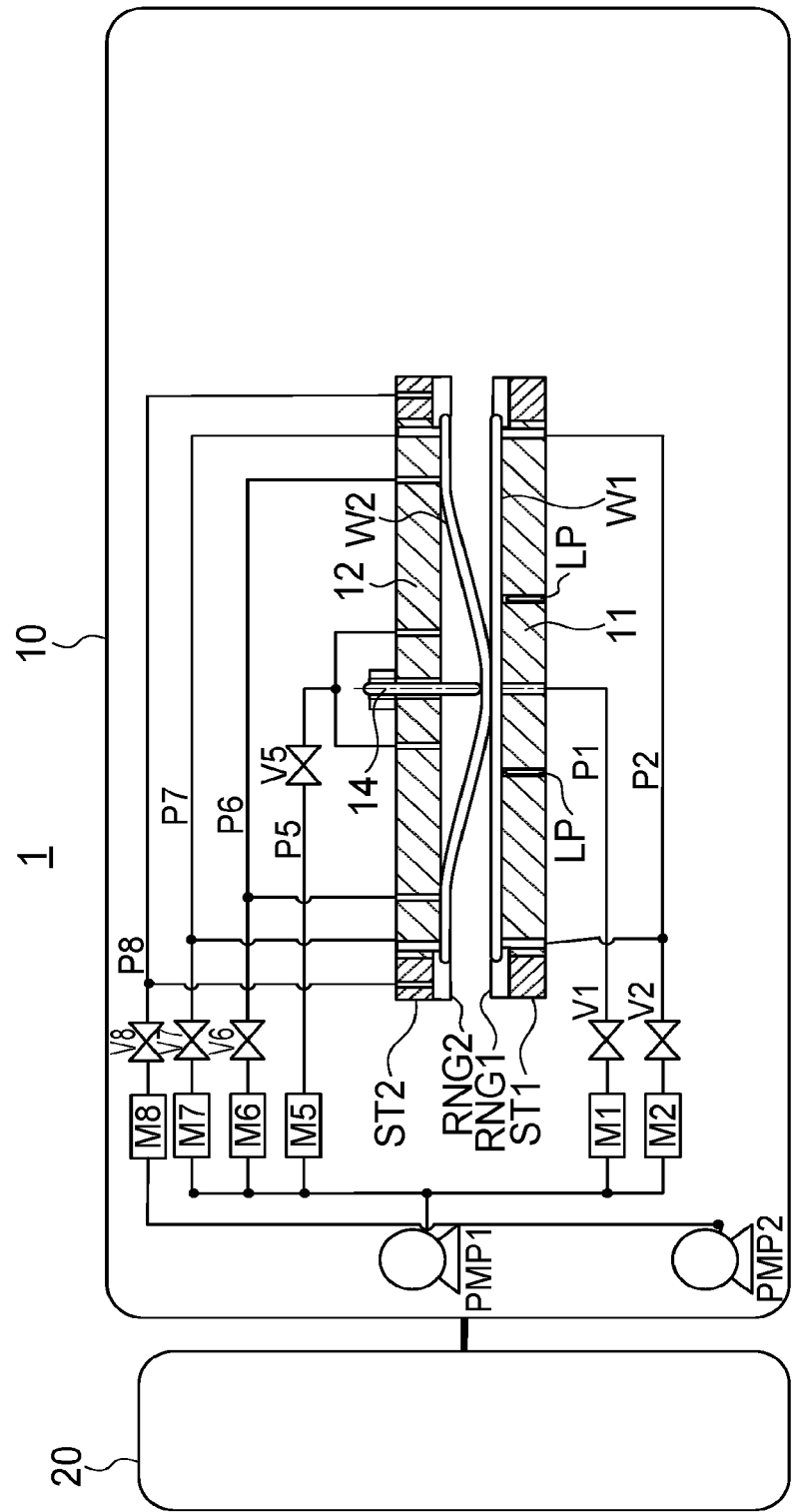
FIG. 8 is a schematic diagram illustrating a configuration example of a bonding apparatus according to a second embodiment.

FIG. 8 is a schematic diagram illustrating a configuration example of a bonding apparatus according to a second embodiment. In the second embodiment, an inner circumferential portion of each of the ring members RNG1 and RNG2 is formed like a tray and has a depression (a spot face). Outer edge portions of the semiconductor wafers W1 and W2 are mounted on the depressions of the ring members RNG1 and RNG2, respectively. The centers of the semiconductor wafers W1 and W2 are sucked onto the holders 11 and 12 by vacuum suction, respectively. The ring member RNG2 is sucked onto the ring stage ST2 by vacuum suction.

The ring members RNG1 and RNG2 may be made of a material that does not thermally expand or thermally contract, such as a metal or a ceramic, because the ring members RNG1 and RNG2 merely allow the semiconductor wafers W1 and W2 to be mounted on the depressions.

Although the semiconductor wafers W1 and W2 are mounted on the ring members RNG1 and RNG2, the ring members RNG1 and RNG2 are not bonded or the like to the semiconductor wafers W1 and W2. Therefore, the holder 12 sucks the semiconductor wafer W2 by vacuum suction, and the ring stage ST2 sucks the ring member RNG2 by vacuum suction. In a case where the ring stage ST2 does not suck the ring member RNG2, the ring member RNG2 may fall down (toward the holder 11) by its own weight when the holder 12 is opposed to the holder 11. Further, a load is applied to the outer edge portion of the semiconductor wafer W2 because of the weight of the ring member RNG2. Therefore, the ring stage ST2 has the openings OP8 as ring suction portions and sucks the ring member RNG2 by vacuum suction. The openings OP8 are suction portions that stop suction finally among the openings OP5 to OP8 when the semiconductor wafers W1 and W2 are bonded to each other.

Meanwhile, the ring stage ST1 faces up even after the ring member RNG1 and the semiconductor wafer W1 are mounted thereon, and it is therefore unnecessary to suck the ring member RNG1 by vacuum suction. In order to stably fix the positions of the ring member RNG1 and the semiconductor wafer W1, an opening that sucks the ring member RNG1 by vacuum suction may be provided.

In the second embodiment, the ring members RNG1 and RNG2 are not caused to thermally expand or thermally contract. Therefore, the heaters HT1 and HT2 and the power supplies PW1 and PW2 are not required. Further, the pipe P3 provided for the ring stage ST1 and the opening OP3 can be omitted. In association with the above omission, the gate valve V3 and the pressure/flow-rate adjuster M3 can also be omitted. By these omissions, the overall configuration of the bonding apparatus 1 can be simplified.

Other configurations of the second embodiment may be identical to corresponding ones of the first embodiment.

Next, a method of bonding the semiconductor wafers W1 and W2 to each other according to the second embodiment is described.

FIGS. 9A to 9F are cross-sectional views illustrating an example of a method of bonding the semiconductor wafers W1 and W2 to each other according to the second embodiment.

Figure 9A:
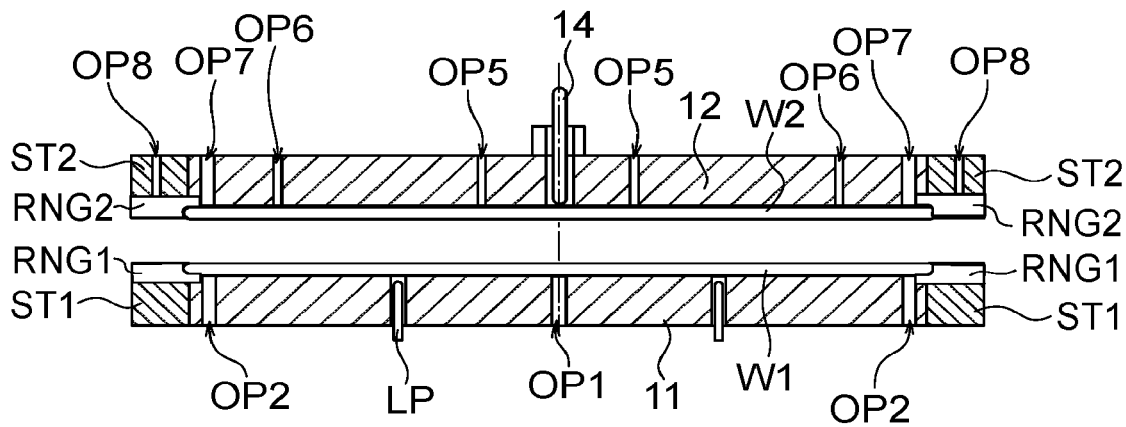
FIG. 9A is a cross-sectional view illustrating an example of a method of bonding the semiconductor wafers to each other according to the second embodiment.

First, as illustrated in FIG. 9A, the ring members RNG1 and RNG2 are placed on the ring stages ST1 and ST2, respectively. The ring member RNG2 is sucked by the openings OP8 onto the ring stage ST2 by vacuum suction.

Next, the semiconductor wafers W1 and W2 are placed on depressions (spot faces) in inner circumferential portions of the ring members RNG1 and RNG2. Accordingly, the semiconductor wafers W1 and W2 are also placed on mounting surfaces of the holders 11 and 12 inside the ring members RNG1 and RNG2.

The openings OP1 and OP2 suck the semiconductor wafer W1 onto the mounting surface of the holder 11. Further, the openings OP5 to OP8 suck the semiconductor wafer W2 onto the mounting surface of the holder 12 and suck the ring member RNG2 onto the ring stage ST2.

Figure 10:
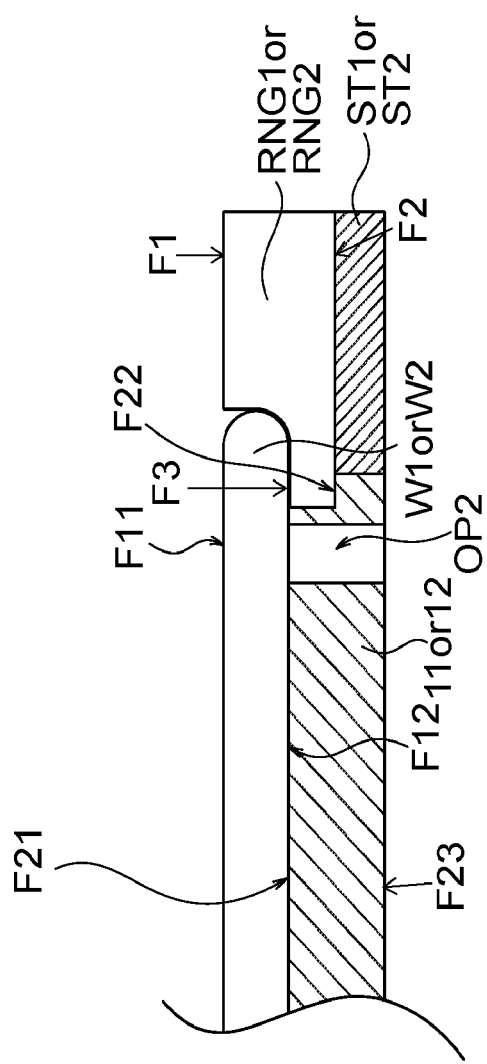
FIG. 10 is a cross-sectional view illustrating configurations of holders, ring stages, and the ring members on outer edge portions of the semiconductor wafers.

FIG. 10 is a cross-sectional view illustrating configurations of the holders 11 and 12, the ring stages ST1 and ST2, and the ring members RNG1 and RNG2 on outer edge portions of the semiconductor wafers W1 and W2. The following descriptions are made to the configuration on the holder 11 side, and descriptions of the configuration on the holder 12 side are omitted.

The holder 11 has a surface (a first surface) F21 on which the semiconductor wafer W1 is mounted and a surface (a second surface) F22 that is depressed from the surface F21 and that allows the ring member RNG1 to be mounted thereon, as mounting surfaces. The surface F22 is substantially flush with a top surface (a mounting surface for the ring member RNG1) of the ring stage ST1. The ring member RNG1 is placed on the ring stage ST1 and the outer edge portion of the holder 11. Therefore, the outer edge portion of the holder 11 is depressed with respect to the center thereof. That is, the thickness of the outer edge portion of the holder 11 is thinner than the thickness of the center thereof.

Meanwhile, the ring member RNG1 is mounted on the holder 11 and the ring stage ST1 with its back surface F2 in contact with the surface F22 of the holder 11 and the ring stage ST1. At this time, a top surface F3 of the depression of the ring member RNG1 is substantially flush with the surface F21 of the holder 11. That is, the inner-circumferential-side top surface F3 of the ring member RNG1 and the surface F21 of the holder 11 are substantially flush with each other as mounting surfaces for the semiconductor wafer W1. Accordingly, the semiconductor wafer W1 can be placed to be substantially flat on the holder 11 and the depression of the ring member RNG1.

Further, an outer-circumferential-side top surface (a surface opposed to the ring member RNG2) F1 on an outer side of the depression of the ring member RNG1 is substantially flush with a top surface (a bonding surface) F11 of the semiconductor wafer W1 placed on the holder 11 and the depression of the ring member RNG1. Accordingly, the bonding surfaces of the semiconductor wafers W1 and W2 and the surfaces of the ring members RNG1 and RNG2 opposed to each other are substantially flush with each other, and bonding spreads appropriately and smoothly.

This configuration is identical to that on the holder 12 side. As illustrated in FIG. 10, the holder 12 has a surface (a third surface) F21 on which the semiconductor wafer W2 is mounted and a surface (a fourth surface) F22 that is depressed from the surface F21 and that allows the ring member RNG2 to be mounted thereon. An inner-circumferential-side top surface F3 of the ring member RNG2 mounted on the surface F22 and the surface F21 of the holder 12 are substantially flush with each other as mounting surfaces for the semiconductor wafer W2. Further, an outer-circumferential-side top surface F1 on an outer side of the depression of the ring member RNG2 is substantially flush with a top surface (a bonding surface) F11 of the semiconductor wafer W2 placed on the holder 12 and the depression of the ring member RNG2. Accordingly, the bonding surfaces of the semiconductor wafers W1 and W2 and the surfaces of the ring members RNG1 and RNG2 opposed to each other are substantially flush with each other, and bonding spreads appropriately and smoothly.

Referring back to FIG. 9A, the holder 12 opposes the semiconductor wafer W2 to the semiconductor wafer W1 on the holder 11. The holder 12 brings the semiconductor wafer W2 closer to the semiconductor wafer W1 in order to make a distance between the semiconductor wafers W1 and W2 a predetermined distance. At this time, the holders 11 and 12 suck entire back surfaces of the semiconductor wafers W1 and W2, respectively.

Figure 9B:
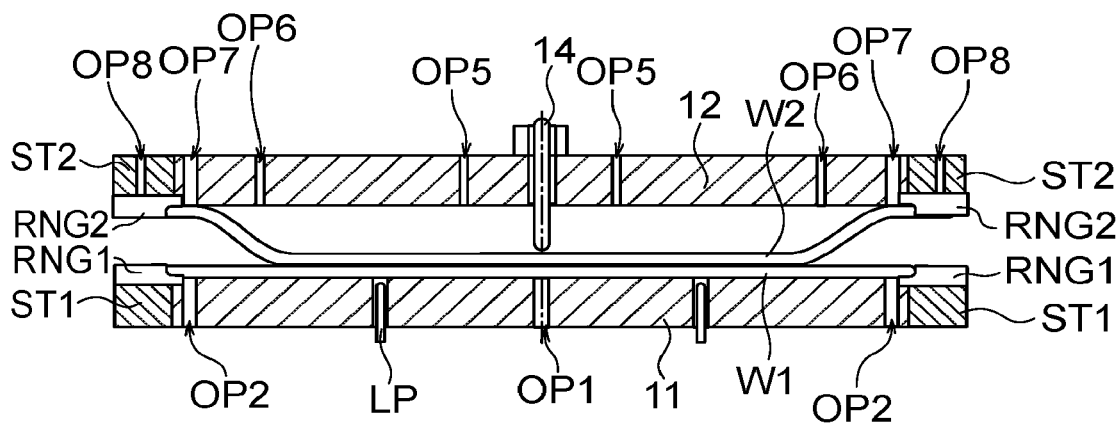
FIG. 9B is a cross-sectional view illustrating an example of the bonding method following FIG. 9A.

Next, the gate valves V5 to V7 in FIG. 8 are in a closed state in turn as described in the first embodiment. Accordingly, evacuation through the openings OP5 to OP7 is stopped in turn. At the same time, as illustrated in FIG. 9B, the pushing portion 14 pushes out the back surface of the semiconductor wafer W2 from the center of the holder 12 toward the semiconductor wafer W1. Accordingly, bonding between the semiconductor wafers W1 and W2 spreads from the center thereof to the outer edge portion.

Figure 9C:
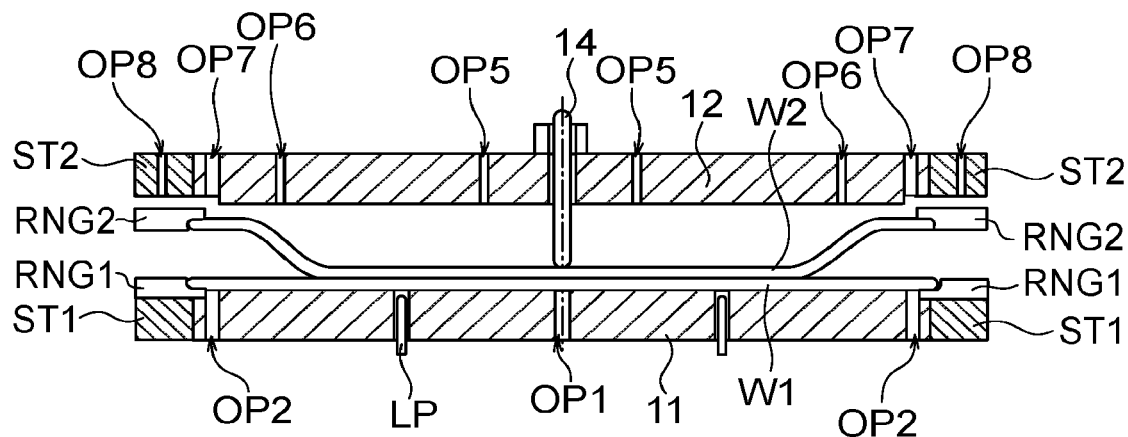
FIG. 9C is a cross-sectional view illustrating an example of the bonding method following FIG. 9B.
Figure 9D:
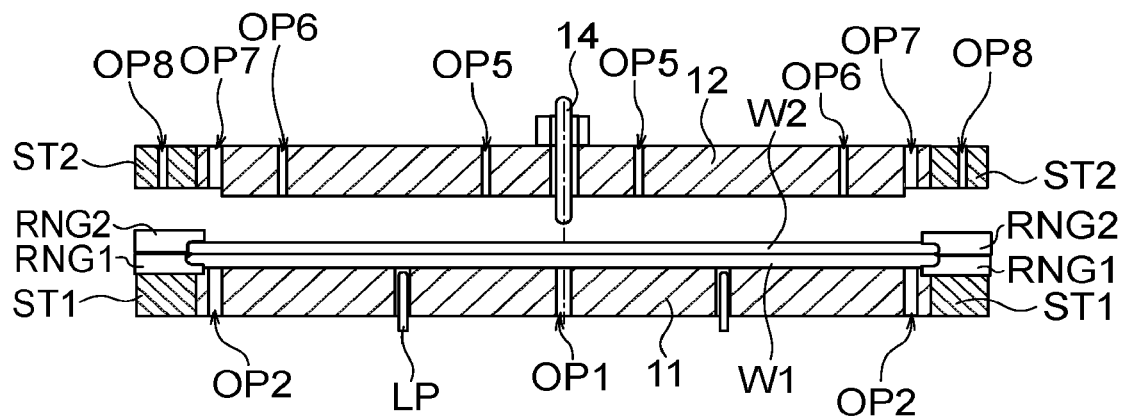
FIG. 9D is a cross-sectional view illustrating an example of the bonding method following FIG. 9C.

Next, the gate valve V8 in FIG. 8 is in a closed state. Accordingly, evacuation through the openings OP8 is stopped. At this time, as illustrated in FIG. 9C, the ring member RNG2 is separated from the ring stage ST2 together with the outer edge portion of the semiconductor wafer W2. Accordingly, as illustrated in FIG. 9D, the semiconductor wafer W2 is entirely bonded to the semiconductor wafer W1 and the ring member RNG2 is in contact with the ring member RNG1.

Also in the second embodiment, because of the ring members RNG1 and RNG2 provided on the outer edge portions of the semiconductor wafers W1 and W2, the speed of bonding between an actual outer edge portion of the semiconductor wafer W1 and an actual outer edge portion of the semiconductor wafer W2 is moderated, and a pressure difference between the semiconductor wafers W1 and W2 is substantially moderated. As a result, the second embodiment can obtain effects identical to those of the first embodiment.

Figure 9E:
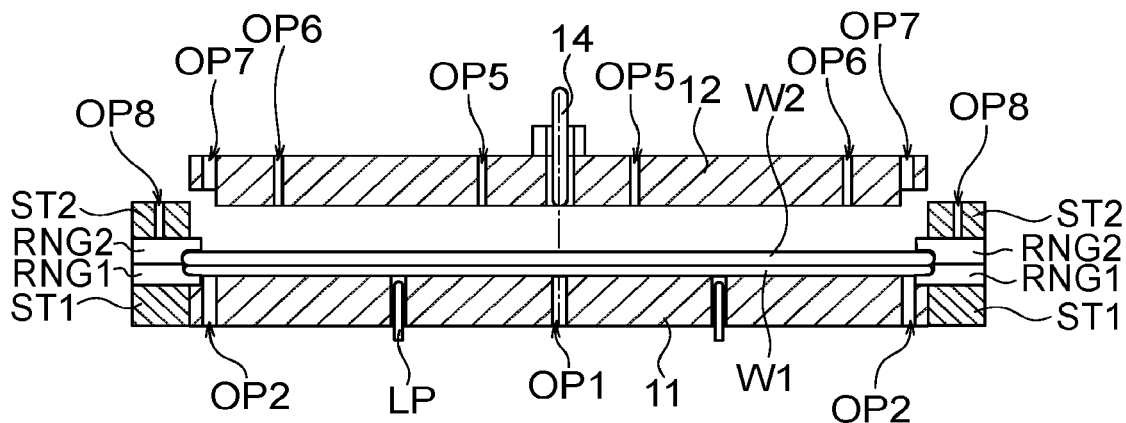
FIG. 9E is a cross-sectional view illustrating an example of the bonding method following FIG. 9D.
Figure 11A:
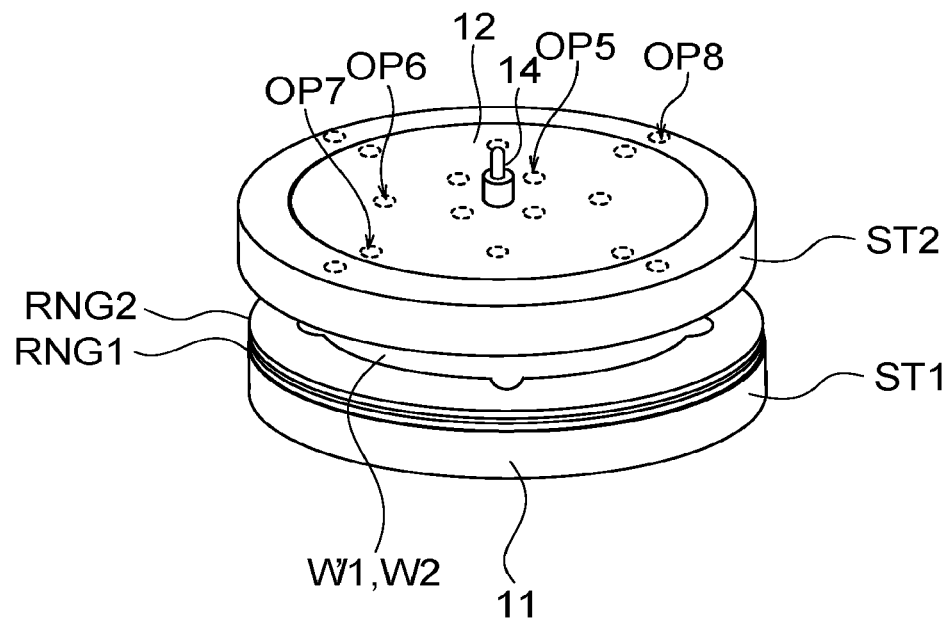
FIG. 11A is a perspective view illustrating detaching the ring members from the semiconductor wafers.
Figure 11B:
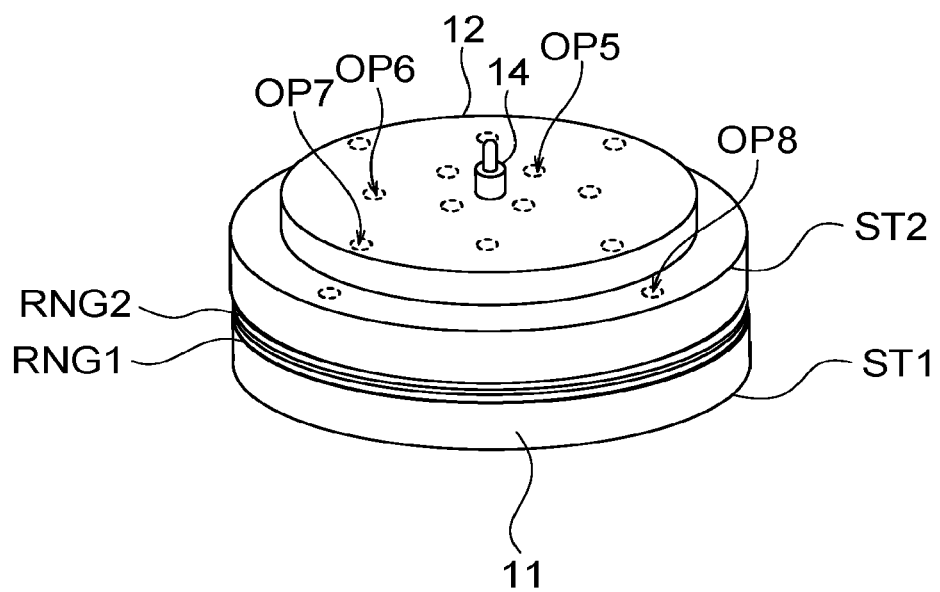
FIG. 11B is a perspective view illustrating detaching the ring members from the semiconductor wafers following FIG. 11A.

Next, as illustrated in FIG. 9E, the ring stage ST2 is brought closer to the ring stage ST1 and is brought into contact with the ring member RNG2. For example, FIGS. 11A to 11D are perspective views illustrating detaching the ring members RNG1 and RNG2 from the semiconductor wafers W1 and W2. After the semiconductor wafers W1 and W2 are bonded to each other and the ring members RNG1 and RNG2 are in close contact with each other as illustrated FIG. 11A, the ring stage ST2 is moved down and is brought into contact with the ring member RNG2 as in the first embodiment, as illustrated in FIG. 11B.

Figure 9F:
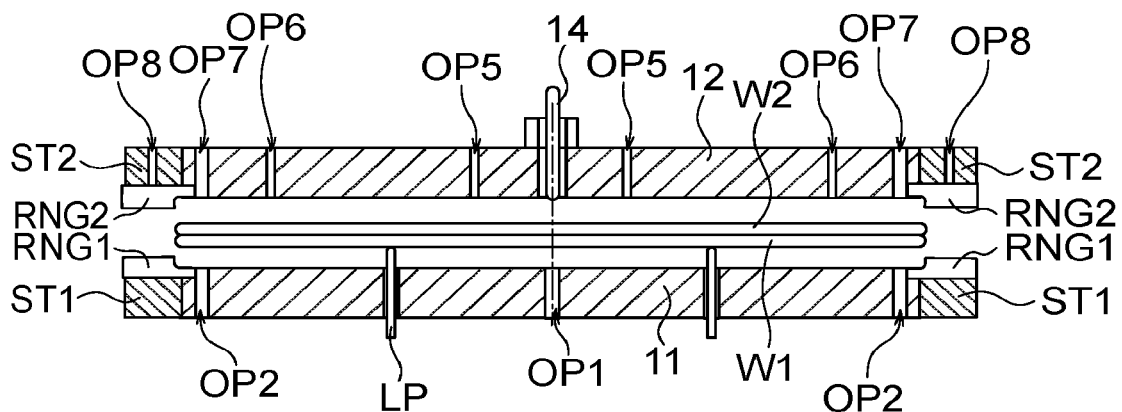
FIG. 9F is a cross-sectional view illustrating an example of the bonding method following FIG. 9E.
Figure 11C:
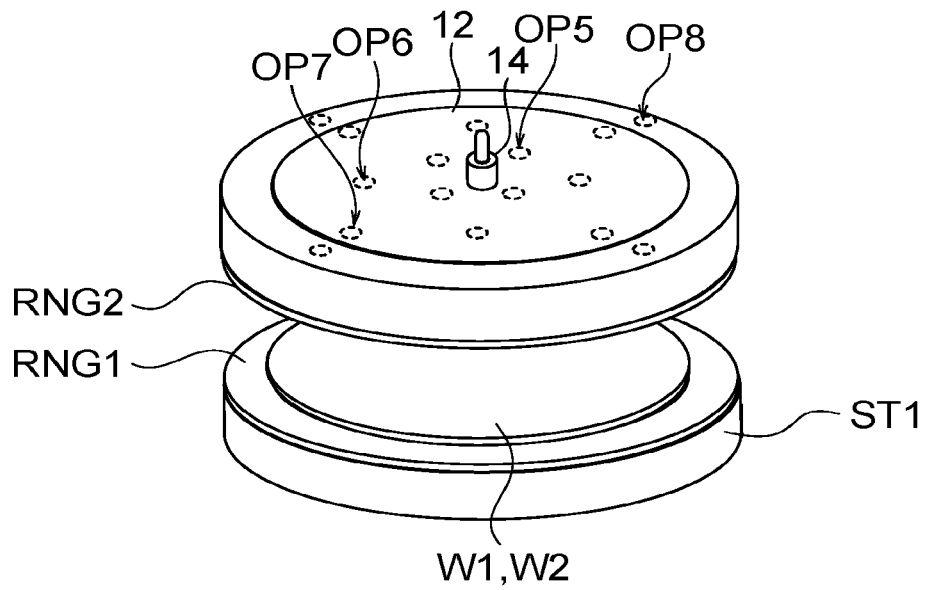
FIG. 11C is a perspective view illustrating detaching the ring members from the semiconductor wafers following FIG. 11B.

Next, as illustrated in FIGS. 9F and 11C, the ring member RNG2 is sucked by the openings OP8 of the ring stage ST2, and the ring stage ST2 is elevated to the position of the outer circumference of the holder 12 to lift the ring member RNG2. That is, the ring stage ST2 returns to its original position while sucking the ring member RNG2 by the openings OP8. Although the semiconductor wafer W2 is mounted on the ring member RNG2, they are not bonded to each other. Therefore, as illustrated in FIG. 11C, the ring stage ST2 can easily separate the ring member RNG2 from the ring member RNG1 while the semiconductor wafers W1 and W2 remain bonded to each other.

Figure 11D:
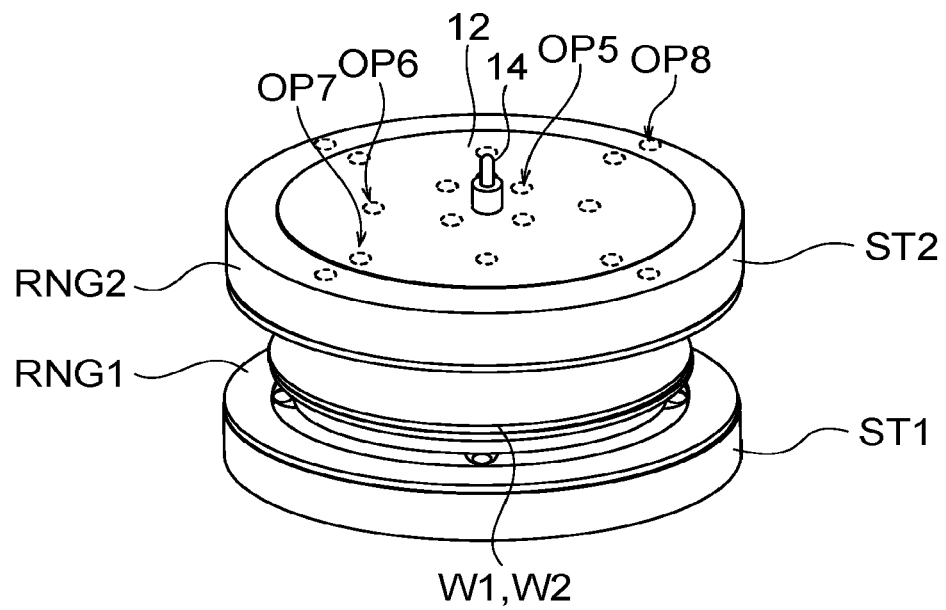
FIG. 11D is a perspective view illustrating detaching the ring members from the semiconductor wafers following FIG. 11C.

Next, as illustrated in FIGS. 9F and 11D, the semiconductor wafers W1 and W2 are lifted by the lift pins LP. Although the semiconductor wafer W1 is also mounted on the ring member RNG1, they are not bonded to each other. Therefore, the semiconductor wafers W1 and W2 can be easily detached from the ring member RNG1.

Configuration of Ring Member in Second Embodiment

FIGS. 12 to 14B are perspective views illustrating configuration examples of ring members according to the second embodiment. In the example illustrated in FIG. 12, the lower ring member RNG1 and the upper ring member RNG2 have the same configuration as each other. The following descriptions are made to the configuration of the ring member RNG1, and descriptions of the configuration of the ring member RNG2 are omitted.

Figure 12:
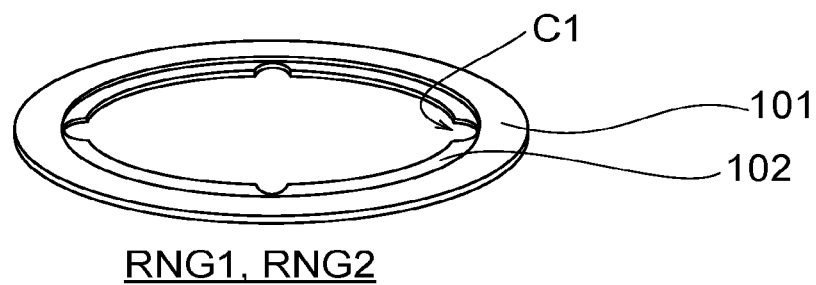
FIG. 12 is a perspective view illustrating a configuration example of the ring member according to the second embodiment.

The ring member RNG1 in FIG. 12 includes an outer annular portion 101 and an inner annular portion 102. The outer annular portion 101 is configured to be annular along a mounting surface of the ring stage ST1. The inner circumference of the outer annular portion 101 is substantially the same as the outer circumference of the semiconductor wafer W1. Accordingly, the semiconductor wafer W1 can be arranged on the inner annular portion 102 located inside the outer annular portion 101. Further, the inner annular portion 102 is connected to an inner circumferential portion of the outer annular portion 101 continuously therewith, and is depressed with respect to the outer annular portion 101 by the thickness of the semiconductor wafer W1. That is, the inner annular portion 102 is configured as a spot face on which the semiconductor wafer W1 is placed. The depth of a step between the outer annular portion 101 and the inner annular portion 102 is substantially equal to the thickness of the semiconductor wafer W1. Accordingly, as described with reference to FIG. 10, a bonding surface of the semiconductor wafer W1 and a top surface of the outer annular portion 101 can be made substantially flush with each other.

Cutouts C1 are provided in the inner annular portion 102. The cutouts C1 are provided at positions corresponding to the openings OP2 of the holder 11, not to hinder suction of the semiconductor wafer W1 by the openings OP2. For example, the openings OP2 in FIG. 10 suck the semiconductor wafer W1 in regions of the cutouts C1. The openings OP2 are arranged concentrically about the center of the holder 11 substantially evenly. In association with this arrangement, the cutouts C1 are also arranged substantially evenly in the circumference of the inner annular portion 102.

In the ring member RNG2, the cutouts C1 are provided to correspond to the openings OP7 provided in the outermost portion of the holder 12. The other configuration of the ring member RNG2 may be the same as the configuration of the ring member RNG1. In a case where the arrangement of the cutouts C1 is the same between the ring members RNG1 and RNG2, the ring members RNG1 and RNG2 have the same configuration as each other. In this case, it is unnecessary to distinguish the ring members RNG1 and RNG2 from each other, and it is possible to easily manufacture and attach the ring members RNG1 and RNG2.

First Modification

Figure 13A:
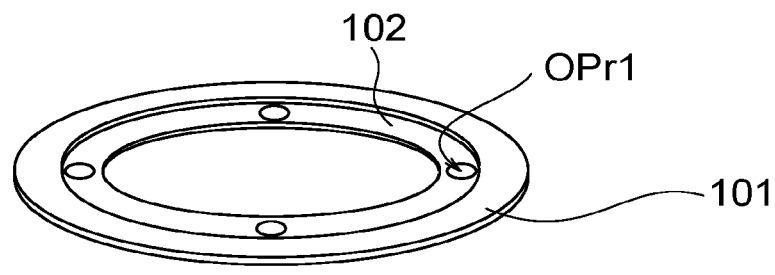
FIG. 13A is a perspective view illustrating a configuration example of the ring member according to the second embodiment.
Figure 13B:
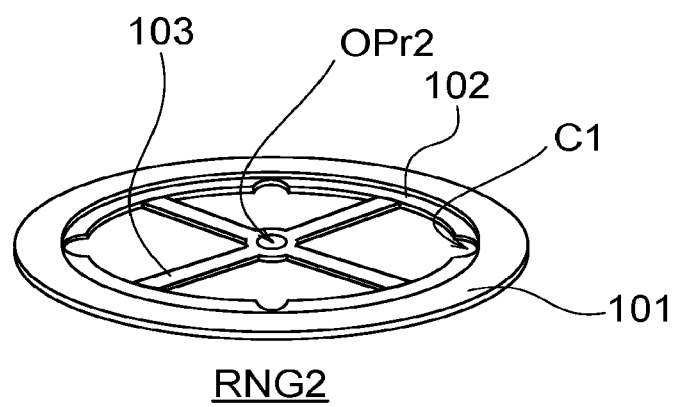
FIG. 13B is a perspective view illustrating a configuration example of the ring member according to the second embodiment.

FIG. 13A is a perspective view illustrating a configuration of the ring member RNG1 according to a first modification. FIG. 13B is a perspective view illustrating a configuration of the ring member RNG2 according to the first modification.

The ring member RNG1 illustrated in FIG. 13A has openings OPr1 in the inner annular portion 102, instead of cutouts. Other configurations of the ring member RNG1 according to the first modification may be identical to those of the ring member RNG1 in FIG. 12.

The openings OPr1 are provided at positions that correspond to and overlap the openings OP2 of the holder 11 in order not to hinder suction of the semiconductor wafer W1 by the openings OP2, as with the cutouts C1 in FIG. 12.

The ring member RNG2 illustrated in FIG. 13B is provided with a support portion 103 in the inner annular portion 102. The support portion 103 is connected to the inner annular portion 102 and is provided inside the inner annular portion 102 to have a substantially cross shape. An opening OPr2 is provided at the center of the support portion 103. The opening OPr2 is formed to overlap the pushing portion 14 at the center of the holder 12 and to have such a size that allows the pushing portion 14 to penetrate therethrough. The support portion 103 can support the semiconductor wafer W2. Other configurations of the ring member RNG2 according to the first modification may be identical to those of the ring member RNG2 in FIG. 12.

The ring member RNG1 in FIG. 13A may be applied to the ring member RNG2. In this case, the ring members RNG1 and RNG2 can have the same configuration as each other. Therefore, it is unnecessary to distinguish the ring members RNG1 and RNG2 from each other, and it is possible to easily manufacture and attach the ring members RNG1 and RNG2.

Further, the ring member RNG2 in FIG. 13B may be applied to the ring member RNG1. In this case, the opening OPr2 is provided to correspond to the opening OP1 in such a manner that suction of the semiconductor wafer W1 by the opening OP1 is not hindered. Also in this case, the ring members RNG1 and RNG2 can have the same configuration as each other. Therefore, it is unnecessary to distinguish the ring members RNG1 and RNG2 from each other, and it is possible to easily manufacture and attach the ring members RNG1 and RNG2.

Second Modification

Figure 14A:
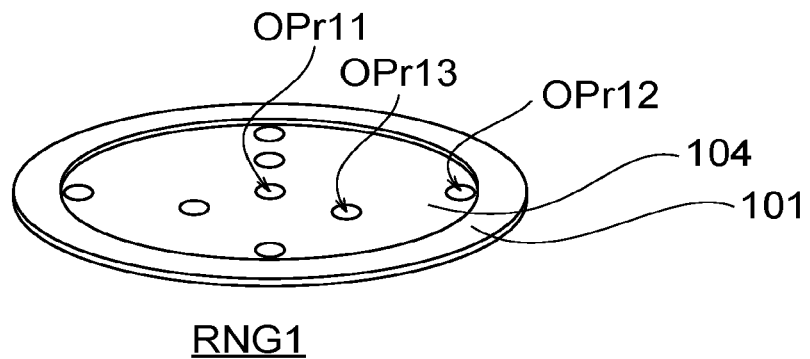
FIG. 14A is a perspective view illustrating a configuration example of the ring member according to the second embodiment.
Figure 14B:
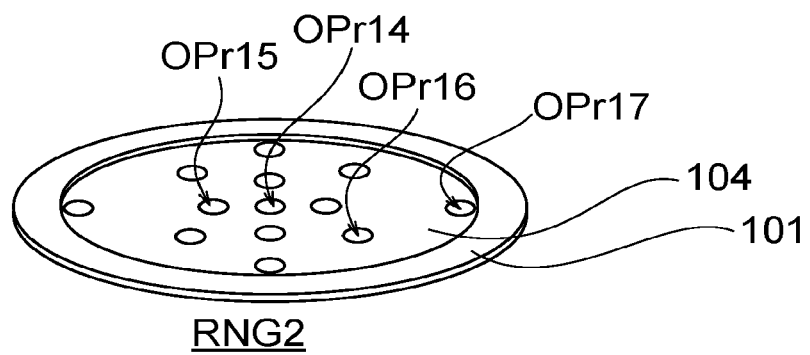
FIG. 14B is a perspective view illustrating a configuration example of the ring member according to the second embodiment.

FIG. 14A is a perspective view illustrating a configuration of the ring member RNG1 according to a second modification. FIG. 14B is a perspective view illustrating a configuration of the ring member RNG2 according to the second modification.

The ring members RNG1 and RNG2 in the second modification each include a plate portion 104 inside the outer annular portion 101. The plate portion 104 is substantially disk-shaped and has substantially the same outer circumference as the inner circumference of the outer annular portion 101, and supports the entire semiconductor wafer W1 or W2.

The plate portion 104 of the ring member RNG1 has openings OPr11 to OPr13 that are arranged concentrically about the center of the plate portion 104. One opening OPr11 is provided to correspond to the opening OP1 of the holder 11. The openings OPr12 are provided to correspond to the openings OP2 of the holder 11. Accordingly, the openings OPr11 and OPr12 do not hinder suction of the semiconductor wafer W1 by the openings OP1 and OP2. Further, the openings OPr13 correspond to the lift pins LP and are formed to have such a size that allows each lift pin LP to penetrate therethrough.

With this configuration, the ring member RNG1 can support the entire semiconductor wafer W1. Other configurations of the ring member RNG1 according to the second modification may be identical to those of the ring member RNG1 in FIG. 12.

The plate portion 104 of the ring member RNG2 has openings OPr14 to OPr17 that are arranged concentrically about the center of the plate portion 104. One opening OPr14 corresponds to the pushing portion 14 at the center of the holder 12 and is formed to have such a size that allows the pushing portion 14 to penetrate therethrough. The openings OPr15 to OPr17 correspond to the openings OP5 to OP7 of the holder 12, respectively. Accordingly, the openings OPr15 to OPr17 do not hinder suction of the semiconductor wafer W2 by the openings OP5 to OP7.

With this configuration, the ring member RNG2 can support the entire semiconductor wafer W2. Other configurations of the ring member RNG2 according to the second modification may be identical to those of the ring member RNG2 in FIG. 12.

Modification of Ring Stage ST1

Figure 15:
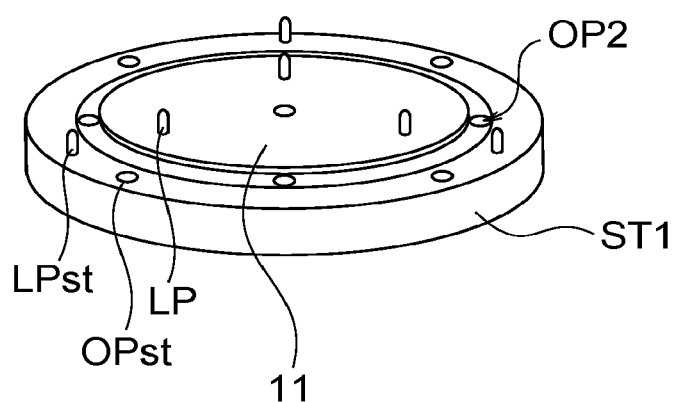
FIG. 15 is a perspective view illustrating a modification of a ring stage.

FIG. 15 is a perspective view illustrating a modification of the ring stage ST1. The ring stage ST1 according to the present modification includes a lift pin LPst and an opening OPst. The opening OPst is provided in the ring stage ST1 in order to suck the ring member RNG1, and is connected to the vacuum pump PMP1 via a pipe (not illustrated). The lift pin LPst is provided in the ring stage ST1 and can lift the ring member RNG1 from a mounting surface of the ring stage ST1.

After the semiconductor wafers W1 and W2 are transported, the lift pin LPst lifts the ring member RNG1 from the ring stage ST1. Accordingly, the ring member RNG1 can be easily transported from the ring stage ST1.

Other configurations of the ring stage ST1 according to the present modification may be identical to those of the ring stage ST1 according to the second embodiment.

Example of Bonding Memory Chips

Figure 16:
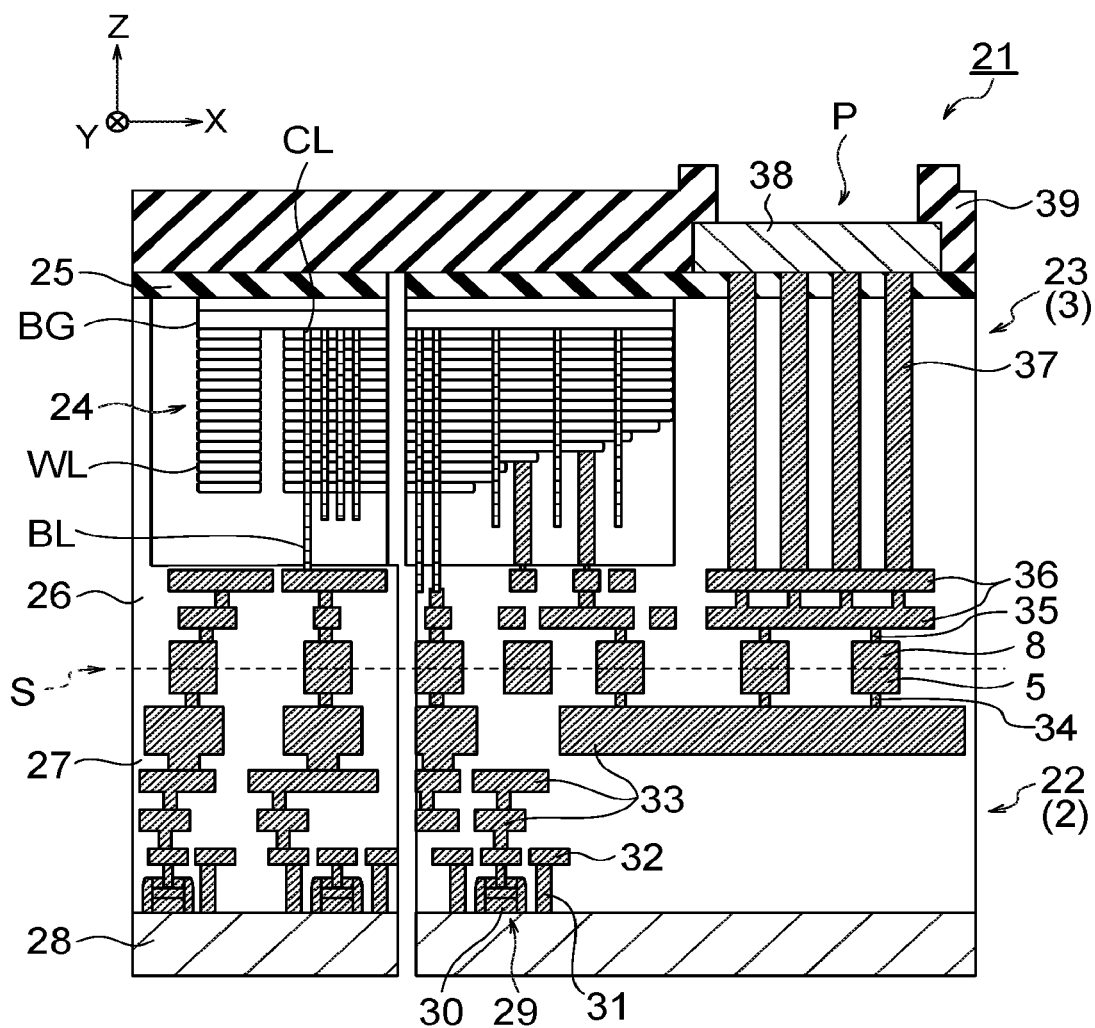
FIG. 16 is a cross-sectional view illustrating an example of a semiconductor chip fabricated by using the bonding apparatus according to any of the above embodiments.

FIG. 16 is a cross-sectional view illustrating an example of a semiconductor chip fabricated by using the bonding apparatus according to any of the above embodiments. A semiconductor chip 21 includes a control circuit chip 22 formed by a portion of a first semiconductor substrate 2 having a first circuit area and an array chip 23 formed by a portion of a second semiconductor substrate 3 having a second circuit area. The semiconductor chip 21 is fabricated by bonding a plurality of semiconductor wafers by using the bonding apparatus 1 and thereafter cutting the semiconductor wafers into individual pieces. Therefore, the control circuit chip 22 and the array chip 23 are bonded to each other.

The array chip 23 includes a memory cell array 24 including a plurality of memory cells, an insulating film 25 on the memory cell array 24, and an interlayer dielectric film 26 below the memory cell array 24. The control circuit chip 22 is provided below the array chip 23. A reference sign S denotes a surface of bonding between the array chip 23 and the control circuit chip 22. The control circuit chip 22 includes an interlayer dielectric film 27 and a substrate 28 below the interlayer dielectric film 27. The substrate 28 is a semiconductor substrate such as a silicon substrate. The insulating film 25 and the interlayer dielectric films 26 and 27 are each a silicon oxide film, a silicon nitride film, or a silicon oxynitride film, for example, and may have a structure of one material or a mixed or multilayer structure of a plurality of materials.

FIG. 16 illustrates the X-direction and the Y-direction that are parallel to a surface of the substrate 28 and are perpendicular to each other and the Z-direction perpendicular to the surface of the substrate 28. Here, the +Z-direction is described as an upward direction and the −Z-direction is described as a downward direction. For example, the memory cell array 24 that functions as the second circuit area in the array chip 23 is located above the substrate 28, and the substrate 28 is located below the memory cell array 24. It is allowable that the −Z-direction is coincident or is not coincident with the gravity direction.

The array chip 23 includes, as an electrode layer in the memory cell array 24, a plurality of word lines WL, a source line BG, a bit line BL, and selection gates (not illustrated). A columnar portion CL that penetrates through the word lines WL is electrically connected to the source line BG at one end and to the bit line BL at the other end. A memory cell is formed at an intersection between the columnar portion CL and each word line WL.

The control circuit chip 22 includes a plurality of transistors 29. Each transistor 29 includes a gate electrode 30 provided on the substrate 28 via a gate insulating film and a source diffusion layer and a drain diffusion layer (both not illustrated) that are provided in the substrate 28. The control circuit chip 22 further includes a plurality of plugs 31 provided on the source or drain diffusion layers of the transistors 29, a wiring layer 32 that is provided on these plugs 31 and includes a plurality of wires, and a wiring layer 33 that is provided on the wiring layer 32 and includes a plurality of wires. The control circuit chip 22 further includes a plurality of via plugs 34 provided on the wiring layer 33 and a plurality of metal pads 5 provided in the interlayer dielectric film 27 on the via plugs 34. The control circuit chip 22 having the first circuit area described above functions as a control circuit (a logic circuit) that controls the array chip 23.

The array chip 23 includes a plurality of metal pads 8 provided on the metal pads 5 in the interlayer dielectric film 26, a plurality of via plugs 35 provided on the metal pads 8, and a wiring layer 36 that is provided on the via plugs 35 and includes a plurality of wires. Each word line WL and each bit line BL are electrically connected to corresponding wires in the wiring layer 36. The array chip 23 further includes via plugs 37 that are provided in the interlayer dielectric film 26 or the insulating film 25 and are provided on the wiring layer 36, and a metal pad 38 provided on the insulating film 25 or the via plugs 37.

The metal pad 38 functions as an external connection pad of the semiconductor chip 21, and can be connected to a mounting board or another device via a bonding wire, a solder ball, a metal bump, or the like. The array chip 23 further includes a passivation film 39 formed on the insulating film 25 and the metal pad 38. The passivation film 39 has an opening P through which a top surface of the metal pad 38 is exposed. The opening P is used for connecting a bonding wire to the metal pad 38, for example.

The bonding apparatus 1 according to the present embodiment can be used for bonding of semiconductor wafers in such a memory device. By this bonding, the metal pad 5 and the metal pad 8 are joined to each other on the bonding surface S. Instead of the metal pads 5 and 8, wires may be joined to each other on the bonding surface S. A metal, for example, copper is used for the metal pads 5 and 8 or wires that are to be joined to each other.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A bonding apparatus comprising:
a first holder configured to hold a first substrate;
a second holder configured to suck a second substrate, oppose the second substrate to the first substrate, and bond the second substrate to the first substrate;
a first ring stage provided on an outer circumference of the first holder and configured to allow a first ring member provided on an outer edge of the first substrate to be mounted thereon;
a second ring stage provided on an outer circumference of the second holder and configured to allow a second ring member provided on an outer edge of the second substrate to be mounted thereon;
a first heater provided in the first ring stage; and
a second heater provided in the second ring stage.

2. The apparatus of claim 1, wherein
the first heater heats the first ring member when the first ring member is attached to and detached from the first substrate mounted on the first holder, and
the second heater heats the second ring member when the second ring member is attached to and detached from the second substrate mounted on the second holder.

3. The apparatus of claim 1, further comprising a ring suction portion provided in the second ring stage and configured to suck the second ring member.

4. The apparatus of claim 3, wherein
the second holder includes a plurality of suction portions configured to suck the second substrate, and
the ring suction portion stops suction of the second ring member after the suction portions stop suction of the second substrate, when the first and second substrates are bonded to each other.

5. The apparatus of claim 1, wherein
a top surface of the first ring member, which is opposed to the second ring member, is substantially flush with a bonding surface of the first substrate, and
a top surface of the second ring member, which is opposed to the first ring member, is substantially flush with a bonding surface of the second substrate.

6. The apparatus of claim 1, wherein the second ring stage is provided to be movable toward the first ring stage in such a manner that a mounting surface of the second ring stage for the second ring member comes close to the first ring stage with respect to a mounting surface of the second holder for the second substrate.

7. The apparatus of claim 1, further comprising a pushing portion provided at a center of the second holder and configured to push out the second substrate from the second holder toward the first substrate.

8. A bonding apparatus comprising:
a first holder configured to hold a first substrate;
a second holder configured to suck a second substrate, oppose the second substrate to the first substrate, and bond the second substrate to the first substrate;
a first ring stage provided on an outer circumference of the first holder and configured to allow a first ring member provided on an outer edge of the first substrate to be mounted thereon;
a second ring stage provided on an outer circumference of the second holder and configured to allow a second ring member provided on an outer edge of the second substrate to be mounted thereon; and
a ring suction portion provided in the second ring stage and configured to suck the second ring member.

9. The apparatus of claim 8, wherein
the second holder includes a plurality of suction portions configured to suck the second substrate, and
the ring suction portion stops suction of the second ring member after the suction portions stop suction of the second substrate, when the first and second substrates are bonded to each other.

10. The apparatus of claim 8, wherein
the first holder has a first surface that allows the first substrate to be mounted thereon and a second surface that is depressed from the first surface and allows the first ring member to be mounted thereon, an inner-circumferential-side surface of the first ring member mounted on the second surface and the first ring stage and the first surface being substantially flush with each other as mounting surfaces that allow the first substrate to be mounted thereon, and
the second holder has a third surface that allows the second substrate to be mounted thereon and a fourth surface that is depressed from the third surface and allows the second ring member to be mounted thereon, an inner-circumferential-side surface of the second ring member mounted on the fourth surface and the second ring stage and the third surface being substantially flush with each other as mounting surfaces that allow the second substrate to be mounted thereon.

11. The apparatus of claim 10, wherein
an outer-circumferential-side surface of the first ring member mounted on the second surface and the first ring stage is substantially flush with a bonding surface of the first substrate mounted on the first surface and the inner-circumferential-side surface of the first ring member, and
an outer-circumferential-side surface of the second ring member mounted on the fourth surface and the second ring stage is substantially flush with a bonding surface of the second substrate mounted on the third surface and the inner-circumferential-side surface of the second ring member.

12. The apparatus of claim 8, wherein the second ring stage is provided to be movable toward the first ring stage in such a manner that a mounting surface of the second ring stage for the second ring member comes close to the first ring stage with respect to a mounting surface of the second holder for the second substrate.

13. The apparatus of claim 8, further comprising a pushing portion provided at a center of the second holder and configured to push out the second substrate from the second holder toward the first substrate.

14. A bonding method using a bonding apparatus that includes a first holder configured to hold a first substrate, a second holder configured to suck a second substrate, oppose the second substrate to the first substrate, and bond the second substrate to the first substrate, a first ring stage configured to allow a first ring member provided on an outer edge of the first substrate to be mounted thereon, and a second ring stage configured to allow a second ring member provided on an outer edge of the second substrate to be mounted thereon, the method comprising:
placing the first ring member on the first ring stage, and mounting the first substrate on the first holder with the first ring member arranged on the outer edge of the first substrate;
placing the second ring member on the second ring stage, and mounting the second substrate on the second holder with the second ring member arranged on the outer edge of the second substrate;
opposing the second substrate mounted on the second holder to the first substrate mounted on the first holder, bonding the second substrate to the first substrate, and bringing the second ring member into contact with the first ring member; and
detaching the first and second ring members from the bonded first and second substrates.

15. The method of claim 14, wherein bonding between the first and second substrates spreads from a center of the first and second substrates to the outer edges, followed by contact between the first and second ring members.

16. The method of claim 14, wherein
when the first substrate is mounted on the first holder with the first ring member arranged on the outer edge of the first substrate,
the first ring member is caused to expand on the first ring stage,
the first substrate is placed inside the first ring member that has expanded on the first holder, and
the first ring member is caused to contract to be attached to the first substrate, and
when the second substrate is mounted on the second holder with the second ring member arranged on the outer edge of the second substrate,
the second ring member is caused to expand on the second ring stage,
the second substrate is placed inside the second ring member that has expanded on the second holder, and
the second ring member is caused to contract to be attached to the second substrate.

17. The method of claim 14, wherein the first and second ring members are caused to expand on the first ring stage, when the first and second ring members are detached from the bonded first and second substrates.

18. The method of claim 16, wherein the first and second ring members are caused to thermally expand or thermally contract.

19. The method of claim 14, wherein
when the first substrate is mounted on the first holder with the first ring member arranged on the outer edge of the first substrate, the first ring member having a depression in its inner circumferential portion,
the first substrate is placed on the depression of the first ring member and the first holder, and
the first substrate and the first ring member are sucked onto the first holder and the first ring stage, and
when the second substrate is mounted on the second holder with the second ring member arranged on the outer edge of the second substrate, the second ring member having a depression in its inner circumferential portion,
the second substrate is placed on the depression of the second ring member and the second holder, and
the second substrate and the second ring member are sucked onto the second holder and the second ring stage.

20. The method of claim 14, wherein
when the first and second ring members are detached from the bonded first and second substrates,
the second ring member is separated from the first ring member and the bonded first and second substrates by sucking the first ring member and the first substrate to which the second substrate is bonded onto the first holder side, and sucking the second ring member onto the second ring stage side.

* * * * *